United States Patent [19]
Stoner et al.

[11] Patent Number: 5,397,428
[45] Date of Patent: Mar. 14, 1995

[54] NUCLEATION ENHANCEMENT FOR CHEMICAL VAPOR DEPOSITION OF DIAMOND

[75] Inventors: Brian R. Stoner, Raleigh; Jeffrey T. Glass, Apex; William M. Hooke, Chapel Hill, all of N.C.; Bradley E. Williams, Worthington, Ohio

[73] Assignees: The University of North Carolina at Chapel Hill, Chapel Hill; North Carolina State University, Raleigh, both of N.C.

[21] Appl. No.: 937,481

[22] Filed: Aug. 28, 1992

Related U.S. Application Data

[63] Continuation-in-part of Ser. No. 811,425, Dec. 20, 1991.

[51] Int. Cl.⁶ ............................................. C30B 29/00
[52] U.S. Cl. ........................................ 117/86; 927/577; 117/95; 117/103; 117/929
[58] Field of Search ..................... 156/610, DIG. 68; 423/446; 427/577; 204/151.71

[56] References Cited

U.S. PATENT DOCUMENTS

| | | | |
|---|---|---|---|
| 3,961,103 | 6/1976 | Aisenberg | 423/446 |
| 4,607,591 | 8/1986 | Stitz | 118/724 |
| 4,691,662 | 9/1987 | Roppel et al. | 118/50.1 |
| 4,740,263 | 4/1988 | Imai et al. | 156/DIG. 68 |
| 4,830,702 | 6/1989 | Singh et al. | 156/613 |
| 4,863,529 | 9/1989 | Imai et al. | 148/33.4 |
| 4,915,977 | 4/1990 | Okamoto et al. | 423/446 |
| 4,925,701 | 5/1990 | Jansen et al. | 427/255.2 |
| 4,939,763 | 7/1990 | Pinneo et al. | 378/161 |
| 4,971,832 | 11/1990 | Arai et al. | 118/723 |
| 5,110,405 | 5/1992 | Sawabe et al. | 156/DIG. 68 |
| 5,169,676 | 12/1992 | Moran et al. | 427/515 |
| 5,201,986 | 4/1993 | Ota et al. | 156/DIG. 68 |

OTHER PUBLICATIONS

Jeng & Tuan; *Oriented Cubic Nucleations and Local Epitaxy During Diamond Grown on Silicon (100) Substrates;* American Institute of Physics; May 1990; pp. 1968–1970.

Yugo & Muto; *Generation of Diamond Nuclei by Electric Field in Plasma Chemical Vapor Deposition;* American Institute of Physics; Appl. Phys. Lett. 58 (10), Mar. 1991; pp. 1036–1038.

*Primary Examiner*—Robert Kunemund
*Attorney, Agent, or Firm*—Bell Selzter Park & Gibson

[57] ABSTRACT

A method and apparatus for enhancing the nucleation of diamond by pretreating a substrate by electrically biasing a diamond film adjacent the substrate while exposing the substrate and the thus biased diamond film to a carbon-containing plasma. The bias pretreatment may be maintained for a time period in the range of about 1 hour to 2 hours to achieve a high diamond nucleation density. Alternatively, the biasing may be continued until diamond film formation is indicated by a change in reflectivity of the surface of the substrate. The biasing pretreating may be used to nucleate diamond heteroepitaxially on a substrate having a surface film formed of a material having a relatively close lattice match to diamond, such as $\beta$-silicon carbide. The apparatus includes a laser reflection interferometer to monitor the surface of the substrate. The laser reflection interferometer is used to monitor growth of the diamond film and cooperates with a controller to control the processing parameters during the diamond growing process.

36 Claims, 34 Drawing Sheets

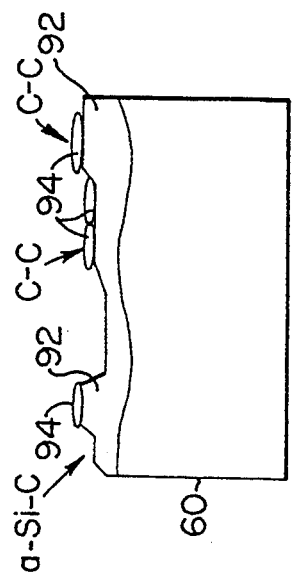
FIG. 18A. BEFORE BIAS
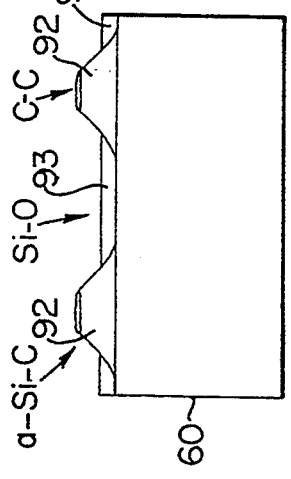
FIG. 18B. 5 MIN.
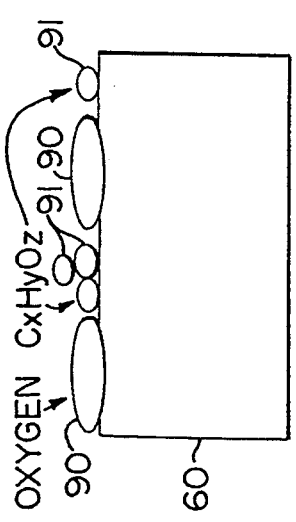
FIG. 18C. 15 MIN.
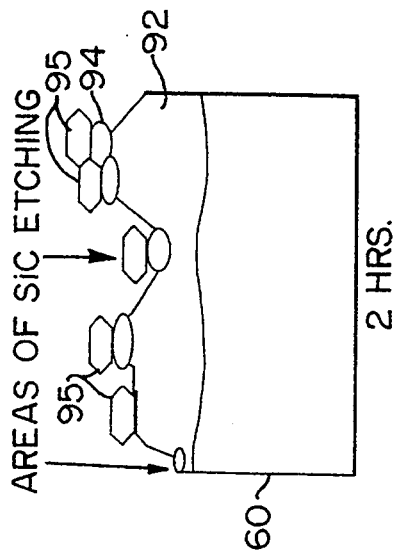
FIG. 18D. 30 MIN.
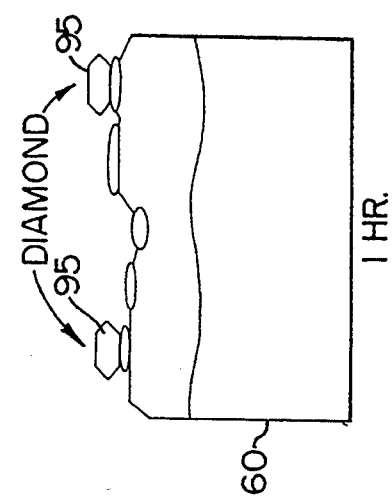
FIG. 18E. 1 HR.
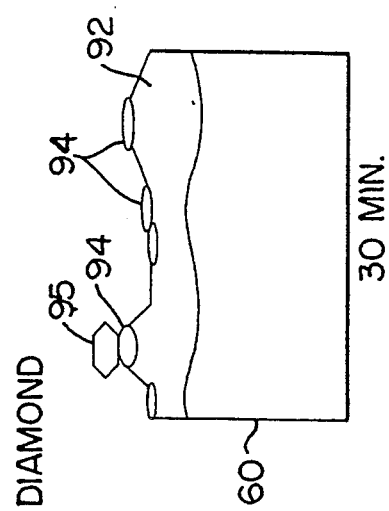
FIG. 18F. 2 HRS.

NUCLEATION ENHANCEMENT FOR CHEMICAL VAPOR DEPOSITION OF DIAMOND

RELATED APPLICATION

This application is a continuation-in-part of application Ser. No. 07/811,425, filed Dec. 20, 1991, now pending.

FIELD OF THE INVENTION

The present invention relates to the field of chemical vapor deposition (CVD), and more particularly, to a method and apparatus for nucleation enhancement for growing a diamond film by plasma CVD.

BACKGROUND OF THE INVENTION

With its large energy band gap and other unique physical properties, diamond is regarded as a desirable material for many engineering applications including wear-resistant tool coatings, optical windows for visible and infrared transmission, abrasives, and particularly high temperature electronic devices. Diamond can be used as a high-grade, radiation resistant, high-temperature semiconductor with potential application in many commercial, military, and aerospace technologies. Thus, there is considerable interest in finding and improving techniques for synthesizing diamond films for these and other applications.

Various techniques for forming diamond films have been proposed. For example, U.S. Pat. No. 4,915,977 to Okamoto et al. proposes forming a diamond film by evaporating carbon onto the substrate by arc discharge at a carbon cathode and applying a negative bias voltage to the substrate so as to form a plasma glow discharge around the substrate. U.S. Pat. No. 4,830,702 to Singh et al. proposes a hollow cathode plasma assisted method and apparatus for forming diamond films. Unfortunately, such electrical discharge methods for forming diamond films often fail to produce high quality diamond films, or layers.

Microwave plasma enhanced CVD has also been used to form diamond films. In addition, techniques have been developed for enhancing the nucleation of diamond onto a silicon substrate, or other substrate, for the subsequent growth of a diamond film by a conventional growth process. For example, it is well known that the diamond nucleation density on a substrate may be increased several orders of magnitude by simply scratching or abrading the substrate prior to placing it into the conventional CVD growth chamber. Although the size and density of grown diamond particles can be controlled to some extent by the size and density of the scratches, each diamond particle still grows in a random orientation. In addition, the maximum density of diamond nuclei is also typically limited to less than about $10^9/cm^2$.

Other attempts have been made to more effectively seed the nucleation process, such as by spraying the substrate with diamond powder through an air brush, or by ultrasonically abrading the substrate surface. U.S. Pat. No. 4,925,701 to Jansen et al. proposes seeding a substrate with a diamond powder to enhance nucleation. Unfortunately, each of these types of preparation techniques has to be performed outside of the plasma CVD reaction chamber.

The scratching and seeding techniques, also fail to produce a surface which is sufficiently smooth to permit in-situ monitoring of the diamond growth rate. Therefore, ex-situ analysis is commonly used, such as cross-sectional scanning electron microscopy or profilometry. Such ex-situ analysis does not permit processing parameters to be controlled during the diamond growth process.

An article entitled Generation of *Diamond Nuclei by Electric Field in Plasma Chemical Vapor Deposition*, by Yugo et al. appearing in Applied Physics Letters, 58 (10) pp. 1036–1038, Mar. 11, 1991, proposes a predeposition of diamond nuclei on a silicon mirror surface prior to the conventional diamond CVD growth process. A high methane fraction (i.e., at least 5 percent) in the feed gas is taught by Yugo along with a negative electrical bias of 70 volts negative with respect to ground applied to the substrate for a time period of just several minutes.

The Yugo article also proposes that a balance must be struck between the biasing voltage and the methane content of the gas mixture. The authors of the Yugo article theorize that an excessive acceleration of the ions from a high voltage can destroy newly formed diamond nuclei. Yugo suggests that revaporization of the newly formed diamond nuclei should be suppressed by mitigating the ion impact by keeping the magnitude of the bias voltage low. Thus, in order to offset the low bias voltage, the degree of carbon over saturation, as determined by the methane percentage, should be increased. Yugo reported that diamond nuclei growth did not occur below 5% methane content and that high densities of nuclei occurred only above 10% methane. In addition, the absolute value of the biasing voltages were maintained below 200 volts negative with respect to ground to avoid revaporization from high energy impacting ions. The total time duration for the pretreatment was limited to between 2 to 15 minutes.

It will also be necessary to produce single crystal diamond thin films over relatively large areas of a substrate in order to fully utilize diamond as a semiconductor material from which to fabricate electronic devices. Homoepitaxial growth of diamond has been reported; however, diamond substrates of sufficient size to make the process economical are not currently available. The growth of heteroepitaxial, or textured diamond films comprising a plurality of locally heteroepitaxial diamond areas, therefore, becomes an important goal if the economical fabrication of diamond electronic devices, for example, is to become a reality.

Heteroepitaxial or textured growth has been reported on cubic-boron nitride (c-BN), nickel and silicon. C-BN has shown promise as a heteroepitaxial substrate for diamond due to its close lattice match and high surface energy. However, it is presently difficult to grow c-BN in large single crystal form. Recent results report that local epitaxial growth of diamond on nickel is attractive. Nickel has a close lattice match with diamond although its catalytic properties on the decomposition of hydrocarbons into $sp^2$ bonded structures may make it difficult to inhibit the formation of graphite during diamond growth and nucleation. Furthermore, it is difficult to obtain diamond films which adhere well to nickel.

An article by Jeng et al. in Applied Physics Letters, 56 (20) p. 1968, (1990), reported limited texturing of diamond on silicon substrates having a semicrystalline silicon carbide surface conversion film thereon. The lattice match between $\beta$-SiC (a=4.36 Å) and diamond (a=3.57 Å) is not extremely attractive; however, $\beta$-SiC grows epitaxially on Si despite a 24% lattice mismatch.

Thus, there still exists a need to form high quality diamond films to take advantage of the many attractive properties of diamond. In addition, there also exists a need to improve heteroepitaxial or textured diamond films for many electronic applications.

SUMMARY OF THE INVENTION

With the foregoing background in mind, it is therefore an object of the present invention to provide a method and apparatus for creating a high diamond nucleation density on a substrate for forming a high quality diamond film on the substrate.

It is another object of the present invention to provide a method and apparatus for creating a high diamond nucleation density for forming a diamond film on a substrate that may be performed in-situ in a vacuum plasma CVD chamber.

It is a further object of the present invention to provide a method and apparatus for creating a high diamond nucleation density on a substrate for the heteroepitaxial growth of diamond on the substrate.

It is yet a further object of the present invention to provide a method and apparatus for permitting in-situ monitoring of the growth of a diamond film on a substrate.

These and other objects, advantages, and features of the present invention are provided by a method and apparatus for pretreating a substrate by providing a diamond film adjacent the substrate, electrically biasing the diamond film, and exposing both the substrate and the thus biased diamond film to a carbon-containing plasma. Preferably the diamond film is formed on a substrate holder in laterally surrounding relation to the substrate.

Without wishing to be bound thereto, applicants theorize that the diamond film contributes to the enhancement of diamond nucleation by either of two mechanisms. First, it is theorized that the diamond is chemically transported from the diamond film to the substrate. In other words, it is possible that the diamond is being moved from the diamond film to the substrate via an etching and deposition process. A second theory is that increased gas phase dissociation is caused by electron emission from the diamond film and that a higher concentration of dissociated hydrocarbons are being created by this electron dissociation process.

The electrical biasing step of the present invention is preferably achieved by electrically biasing the substrate holder and, therefore, biasing the diamond film on the substrate holder. The substrate is also electrically biased concurrently with the diamond film since the substrate rests upon the substrate holder. The substrate holder is preferably biased at a peak value of not less than about 250 volts negative with respect to ground while the diamond film and substrate are exposed to a carbon-containing plasma containing an atomic percentage of carbon of not more than about 0.3 atomic percent. The electrical bias supplied to the substrate may be either pure DC, pulsed DC, alternating current (AC 50 or 60 Hz), or radio frequency (RF), as long as at least a portion of the electrical bias waveform is not less than about $-250$ volts.

Preferably the plasma gas mixture includes not more than about 5 percent by weight methane, and more preferably not more than about 2 percent by weight methane. Diamond may then be deposited onto the thus pretreated substrate by conventional plasma enhanced CVD or other conventional CVD processes.

It has been found that to achieve high diamond nucleation density when using an electrical bias of about $-250$ volts, the pretreatment of the substrate is preferably carried out for a period of time in the range of between about 1 hour to 2 hours. When the diamond film is grown on the pretreated substrate, the electrical biasing of the substrate is preferably discontinued and the substrate permitted to be electrically floating with respect to ground, or grounded. Electrical biasing during diamond growth has been found to produce a lower quality diamond film.

According to one aspect of the present invention, to determine when the electrical biasing of the substrate should be discontinued, the reflectivity of the substrate surface may be monitored during the pretreating. When the reflectivity changes, indicating the start of growth of diamond on the thus pretreated substrate, the electrical biasing is preferably discontinued.

During pretreatment, the pressure of the gas may be maintained at about 1 torr to 100 torr, and preferably about 15 torr, and the substrate maintained at a temperature of about 350° to 1000° C., and preferably about 650° C. In addition, the substrate is preferably immersed in the plasma during the pretreatment and may be repositioned in spaced apart relation from the plasma during the growth of the diamond film.

According to another aspect of the invention, a textured or heteroepitaxial diamond film may be formed on a non-diamond substrate having a surface film, or outer film, of a material closely lattice matched to diamond. Suitable materials include those selected from the group consisting of refractory metals and their carbides, cubic-boron nitride, $\alpha$-silicon carbide, $\beta$-silicon carbide, copper and nickel. The substrate surface film may be formed in situ on the substrate by conventional CVD processing as would be readily understood by those skilled in the art. As used herein, the term "substrate surface film" may also include a bulk quantity of the material closely latticed matched to diamond, as would also be readily understood by those skilled in the art.

The substrate surface film may be prepared by polishing the film, oxidizing the polished film to remove polishing damage, and stripping the oxide prior to the pretreating step. Then the pretreatment as described above and diamond growth may be performed to produce the textured or locally heteroepitaxial diamond film. To prevent excessive damage to the surface of the substrate surface film, the biasing is preferably performed for no more than about 30 minutes when an electrical bias of $-250$ volts is applied to the substrate holder.

A further aspect of the present invention is that a diamond film may be formed having a desired nucleation density by controlling the length of time of the pretreatment step. Stated in other words, the desired nucleation density may be controlled over several orders of magnitude, by controlling the time of pretreatment.

Yet a further aspect of the present invention is that the growth of diamond may be readily measured in situ by laser reflection interferometry (LRI) because of the relatively smooth surface that results from the pretreatment according to the invention. Accordingly, the growth of the diamond may be monitored in real time and the CVD processing parameters controlled to achieve a desired growth rate or growth quality of the diamond film. Laser reflection interferometry may also be used to detect that the diamond film is starting to form and, therefore, that the electrical biasing should be discontinued.

The apparatus according to the present invention includes an evacuable chamber, a substrate holder positioned within the chamber, and means for generating a carbon-containing plasma adjacent the substrate holder. The substrate holder includes an electrically conductive-substrate platform having a diamond film coating on a predetermined portion of the platform. More particularly, the diamond film preferably includes an opening extending vertically therethrough for receipt therein of the substrate. Thus, the diamond film is laterally adjacent and surrounding the substrate. The substrate holder is electrically connected to bias means, such as a DC, pulsed-DC, AC, or RF power supply.

The apparatus may also include a controller for controlling the electrical bias applied to the substrate; the microwave power, gas flow ratio mixture, and pressure for generating the plasma; and the substrate temperature. Thus, the processing parameters may be controlled in real time during the pretreatment period, and also during the diamond growth process.

BRIEF DESCRIPTION OF THE DRAWINGS

FIGS. 18A-18F show various stages in a model of diamond nucleation corresponding to Example 5.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, applicants provide these embodiments so that this disclosure will be thorough and complete, and will fully convey the scope of the invention to those skilled in the art. Like numbers refer to like elements throughout. The thickness of films and regions are exaggerated for clarity.

Figure 1A:
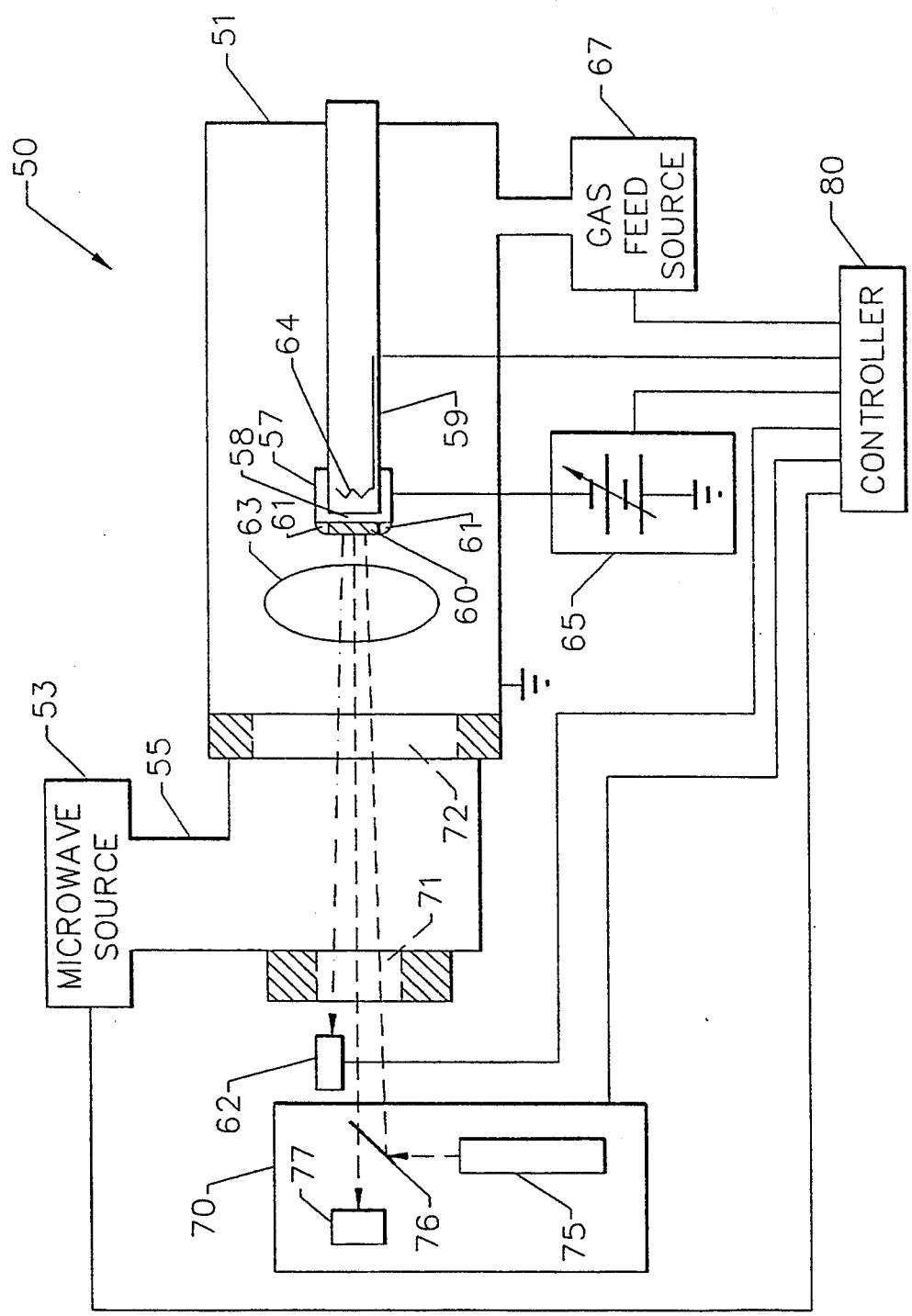
FIG. 1A is a schematic diagram of the apparatus according to the present invention.

A schematic representation of the CVD apparatus according to the present invention is generally designated as 50 in FIG. 1A. The CVD apparatus 50 preferably includes a conventional CVD reactor 51, such as an ASTeX microwave plasma CVD reactor available from ASTeX Company of Woburn, Mass.

The apparatus 50 has a controllable microwave power source 53 coupled to the reactor 51 by a rectangular waveguide section 55 to generate a plasma 63 within the reactor for microwave plasma enhanced CVD. The microwave power source 53 may be an ASTeX S-1000, 2.45 GHz microwave supply. The reactor 51 further includes a retractable substrate holder 57 positioned therein. A substrate 60 to be processed is positioned on the substrate holder 57 and a heater 64 (e.g., a tantalum heater) associated with the substrate holder is used to control the substrate temperature independent of the plasma power. The temperature of the substrate 60 may be measured by a conventional optical pyrometer 62.

The plasma 63 forms at a stable position in a medial portion of the reactor 51. The substrate 60 position relative to the plasma 63 may be varied between 0 (immersed in the plasma) and 8 centimeters by moving the retractable substrate holder 57 with respect to the reactor 51. The substrate holder 57 is connected to a controllable DC power supply 65 in the illustrated embodiment to electrically bias the substrate holder 57 with respect to ground. Alternately, the substrate holder may be isolated from ground so that it is at a floating electrical potential, or the substrate holder may be connected to ground, such as during growth of diamond on the pretreated substrate. Other electrical bias power supplies may be used in addition to the illustrated DC power supply 65 which provides a pure DC bias. For example, a conventional pulsed-DC power supply, AC (60 Hz) power supply, or RF power supply may also be used to bias the substrate holder 57.

A conventional gas feed source 67, including a vacuum pump and/or other conventional process pumps, are connected to the reactor 51. The gas feed source 67 controls the pressure within reactor 51 and the gas flow rate, as well as the mixture of feed gasses.

According to another aspect of the invention, a laser reflection interferometer 70 may be positioned outside of the reactor 51 so that a laser beam may be directed through a pair of spaced apart view ports 71, 72 to the surface of the substrate 60, reflected from the substrate, and back to the interferometer 70. The laser reflection interferometer 70, as would be readily understood by those skilled in the art, includes a laser 75, a beam directing prism 76, and an optical detector 77. The laser may be a helium-neon laser with a wavelength of 630 nanometers. The laser reflection interferometer 70 is coupled to a controller 80, such as a computer or microprocessor, operating under stored program control. The laser reflection interferometer 70 may be used in-situ to monitor the growth of a diamond film on the substrate 60 after the substrate has been pretreated to achieve high diamond nucleation density. For example, the quality of the diamond film may be determined by the intensity of the reflected beam. As would be readily understood by those skilled in the art, both surface roughness and clarity are indications of the quality of the diamond film.

The rate of growth of diamond may also be readily monitored by the apparatus 50 as would be readily understood by those skilled in the art. The controller 80 may be coupled to other controllable components of the apparatus 50 so that real time corrections may be made to the processing parameters during the growth of the diamond film.

Referring now to the greatly enlarged view of a portion of the substrate holder 57 as shown FIG. 1B, another aspect of the present invention will now be explained. The substrate holder 57 includes a substrate holding platform 58, such as a molybdenum cap, secured to the end of a tubular body 59, as would be readily understood by those skilled in the art. According to the invention, the substrate platform 58 includes a diamond film 61 on a predetermined portion thereof. As illustrated, the diamond film 61 preferably includes an opening extending vertically therethrough having a circular cross-sectional shape to receive therein a conventional circular substrate 60. Thus, the diamond film 61 is in the form of a ring that is laterally adjacent and laterally surrounds the substrate 60. Accordingly, both the diamond film 61 and the substrate 60 may be readily exposed to the plasma 63.

The diamond film 61 may also coat the entire substrate platform 58. In other words, the diamond film 61 may also extend along the surface of the substrate platform 58 beneath the substrate 60. Other positions for the diamond film are also possible as long as the diamond film is connected to the bias power supply 65 and is exposed to the plasma 63. Exposed to the plasma 63 means that the diamond film 61 and the substrate 60 are immersed in the plasma glow region, or more typically, positioned contiguous with the plasma sheath region which in turn is below the plasma glow region.

Figure 1B:
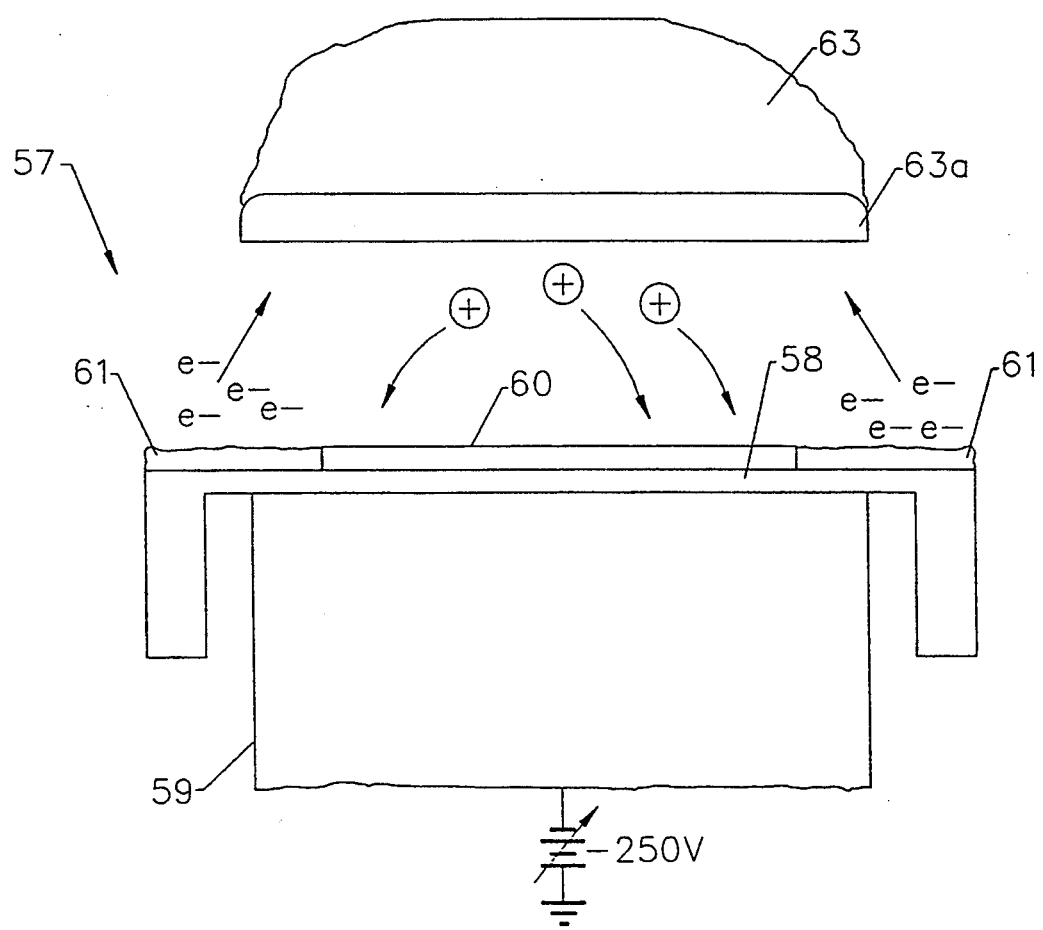
FIG. 1B is a greatly enlarged schematic cross-sectional view of a portion of the substrate holder and plasma as shown in FIG. 1A.

As shown in FIG. 1B, the majority of the current is believed to be supplied by electrons e− emitted from the diamond film 61, as opposed to ions ⊕ accelerated towards the substrate 60. Without wishing to be bound thereto, applicants accordingly theorize that the diamond film 61 contributes to the enhancement of diamond nucleation by either of two mechanism. First, since the diamond film 61 appears to become depleted over time, it is possible that the diamond is being chemically transported from the diamond film 61 to the substrate 60. In other words, it is possible that diamond is being moved from the diamond film 61 to the substrate 60 via an etching and deposition process.

Another theory is that increased gas phase dissociation is caused by electron e− emission from the diamond film 61 and the higher concentration of dissociated hydrocarbons are being created by this electron dissociation process. It was also observed that under higher biases, a lower region of the plasma 63a began to appear red, indicative of increased hydrogen dissociation. If hydrogen dissociation is increased, then, hydrocarbon dissociation should increase as well. It is therefore theorized that a higher concentration of dissociated hydrocarbons, as required for diamond nucleation, are being created via this electron dissociation process.

In the parent application to the present application, Ser. No. 07/811,425, filed on Dec. 20, 1991, the entire disclosure of which is incorporated herein by reference, it was believed that biasing of the substrate provided the predominant effect resulting in the high nucleation densities achieved. During repetitive experiments relating to studying diamond nucleation densities, exposed portions of the substrate holder surrounding the substrate became serendipitously coated with polycrystalline diamond. In an attempt to increase the current flux to the substrate and thereby increase the nucleation density, the molybdenum substrate holder was sand blasted to remove the polycrystalline diamond film accumulated thereon. It was speculated that with the diamond film removed from the substrate holder, that the effective surface area of the electrode would be increased and the current flux would also be thereby increased. Accordingly, an increase in current flux was expected to increase the efficiency of the nucleation process.

Contrary to expectations, however, when the diamond film was removed from the substrate holder, both the current flux and the nucleation density decreased dramatically. Further experiments were then performed including measuring the current flux for an alumina coated substrate holder also at a bias of −250 volts. The results of these experiments are summarized in Table 1 below.

TABLE 1

| Substrate Coating | Current (mA) | Nucleation |
|---|---|---|
| diamond | 100 | high |
| none | 20 | none |
| alumina | 20 | none |

As noted in TABLE 1, when the substrate holder is either uncoated or alumina (insulator) coated, the current is one-fifth that obtained with the diamond coated substrate holder. Moreover, no noticeable nucleation occurred when the substrate holder was either uncoated or alumina coated as compared to the high diamond nucleation densities achieved with the diamond coating on the substrate holder. Accordingly, it is now theorized that the electrically biased diamond film positioned adjacent the substrate provides the predominant effect in achieving high diamond nucleation densities.

The method according to the invention for pretreating a substrate to create a high diamond nucleation density for the growth of a diamond film thereon includes the steps of providing a diamond film adjacent the substrate, and electrically biasing the diamond film while exposing both the substrate and the thus biased diamond film to a carbon-containing plasma.

As noted above, the diamond film is preferably formed on the substrate holder and is biased along with the substrate. The substrate holder is preferably biased at a peak absolute value of −250 volts or greater, with respect to electrical ground. Pulsed DC, AC, and RF may be used to bias the substrate holder. Preferably the carbon-containing plasma has an atomic percentage of carbon of not more than about 0.3 atomic percent, such as provided by a plasma gas mixture including not more than about 5 percent by weight of methane, and more preferably not more than about 2 percent methane by weight. Other carbon-containing gasses may also be used including those selected from the group consisting of ethane, ethylene, acetylene, acetone, ethanol, carbon dioxide, $CCl_4$, $C_2Cl_4H_2$, $CCl_3CF_3$, $CCl_3CH_2OH$ inclusive of aliphatic hydrocarbons with from about 1 to about 10 carbon atoms per molecule.

The pretreatment is preferably carried out for a predetermined time, such as for at least about 1 hour to 2 hours for a high nucleation density and with an electrical bias of about 250 volts negative with respect to ground. The time period roughly equates to the start of the diamond growth on the substrate. It has also been found that the electrical bias should be discontinued after pretreatment in order to grow a high quality diamond film. Accordingly, a thinner, more complete polycrystalline diamond film may be produced over a shorter growth period on a silicon substrate. The method is cleaner and substantially less destructive than scratching, abrading, or externally treating the silicon substrate with a carbon-containing substance. The method according to the present invention has also been found to produce high nucleation density which makes possible more complete and thinner diamond films, such as may be useful for forming thinner diamond windows. The method may also be advantageously used to coat irregularly shaped objects with diamond, such as drill bits, where uniform abrasion of an irregular surface, as required for conventional abrading techniques, is difficult. In addition, better adhesion of the diamond film to the substrate may be obtained by the method according to the invention.

The method according to the present invention provides a high nucleation density without requiring scratching or abrading the substrate surface and achieves much higher nucleation densities than those achieved on scratched substrates. The enhanced nucleation allows a complete film composed of small grains to form in a relatively short time. Accordingly, the diamond film formed is smoother compared to conventionally formed diamond films. The relative smoothness of the substrate surface produced by the method according to the present invention permits LRI to be used during the diamond growth process so that real time control of the growth processing parameters is possible.

LRI requires a relatively smooth surface to avoid surface scattering and the commensurate drop in reflected intensity. Current alternatives to LRI usually involve ex-situ analysis such as cross-sectional SEM or profilometry. LRI permits changes in growth to be continuously monitored while a diamond deposition is in progress; thus, changes in these rates during a deposition, either due to purposeful changes in growth parameters or accidental changes due to unforeseen problems can be determined and the processing parameters adjusted accordingly.

LRI operates by the simple superposition of two light waves from both the top surface of the growing diamond film, as well as the interface between the film and the substrate see, for example "Optical Characterization Techniques for Semiconductor Technology," by Olson et al., SPIE, Vol. 276, p. 128 (1981). The light waves add and as the film continues to grow there is a cycling of the intensity due to the alternating periods of both constructive and destructive interference. For monochromatic light the growth rate (R) may be calculated as:

$$R=(\lambda/2\eta)/T,$$

where $\lambda$=wavelength of the laser light, $\eta$=index of refraction of the diamond film, and T=period between interference cycles. For CVD diamond, an index of refraction of natural diamond may be used ($\eta$=2.4). Since this index may vary with the quality of diamond, it may be necessary to adjust the value of $\eta$ utilizing a series of calibration experiments. This may be accomplished by performing depositions to cover the desired extremes in relative quality as determined by some independent technique, such as Raman spectroscopy. Next the thicknesses of the films are measured and compared to those calculated from LRI. One may then solve for $\eta$ in the above equation to determine the index of refraction at those extremes.

During pretreatment there is a period of time during which no diamond growth is detected. LRI permits one to directly observe and account for this nucleation period. During the nucleation period, the reflected intensity is relatively flat, but as soon as the diamond film begins to grow, there is a noticeable decrease in the reflected intensity. Applicants theorize without wishing to be bound to any theory, that this initial drop in reflectivity is due to the absorption of light by the surface film of carbon which is deposited during the pretreatment period. When this drop in intensity is observed, the pretreatment may be stopped and standard diamond growth allowed to begin. Discontinuing the bias voltage thus allows the substrate to have a floating potential. It has been found that if the bias voltage is maintained, then the carbon film will continue to grow, followed by a poorer quality diamond than in the case where the bias voltage is discontinued. LRI makes it possible to measure the nucleation period, as well as the diamond film growth rate, either of which may vary with changes in processing parameters.

Applicants theorize, without wishing to be bound thereto, that the relatively high electrical bias of the present invention creates a higher saturation of diamond growth (carbon) species and thus helps to stabilize the existing nuclei already formed on the substrate. Applicants also theorize that the lower concentration of the carbon-containing gas (e.g., not more than about 5 percent by weight for methane, and preferably not more than about 2 percent by weight methane) during the pretreatment produces a better quality diamond. As the methane concentration is increased for example, more undesirable graphite and amorphous carbon may be incorporated into the diamond. From initial in-vacuo surface analytical measurements coupled with a growth series, little, if any, graphite is formed on the substrate surface if low methane concentrations are used. In contrast, a higher methane (and higher carbon) concentration is likely to form graphite in the early stages of the biasing during the pretreatment. Additionally, if diamond then nucleates on the graphite, the adhesion of the diamond film to the substrate is likely to be very poor. It is further theorized that the relatively long pretreatment time of one to two hours for a mirror finished silicon substrate may give the silicon carbide interfacial film a chance to partially crystallize, thus improving the integrity of the interfacial film.

Another aspect of the present invention is the ability to control the nucleation density of the diamond film over several orders of magnitude by controlling only the pretreatment time.

A further aspect of the invention is that a heteroepitaxial diamond film may be formed on a substrate having a surface film of a material with a relatively close lattice match with diamond selected from the group consisting of refractory metals and their carbides, cubic-boron nitride, $\alpha$-silicon carbide, $\beta$-silicon carbide, copper, and nickel. The term "refractory metal" relates to a metal which exhibits refractory properties, namely a metal characterized by its ability to withstand extremely high temperatures (i.e., temperatures greater than about 1500° C.). Exemplary refractory metals are transition element metals, and preferably are selected from the group consisting of Group IV, V and VI transition element metals (CRC Handbook, 71st Ed.). Exemplary refractory metals include titanium, tantalum, tungsten, molybdenum, hafnium and niobium.

The surface film of the substrate is pretreated as described above, however, the biasing is preferably carried out for a shorter time of not more than about 30 minutes at an absolute value of not less than about 250 volts negative with respect to ground to prevent damage to the substrate surface film. As described in further detail below in Example 6, a $\beta$-SiC film on a silicon substrate was pretreated with the electrical bias producing a locally heteroepitaxial diamond film.

These and other aspects of the present invention are more fully explained below in the following Examples which are illustrative but not limiting of the invention. In the Examples, chemical compositions and structures were characterized by X-ray photoelectron spectroscopy (XPS), auger electron spectroscopy (AES), and surface electron energy loss spectroscopy (EELS), as well as high resolution cross-sectional transmission electron microscopy (XTEM), scanning electron microscopy (SEM) and Raman spectroscopy.

EXAMPLE 1

Figure 2:
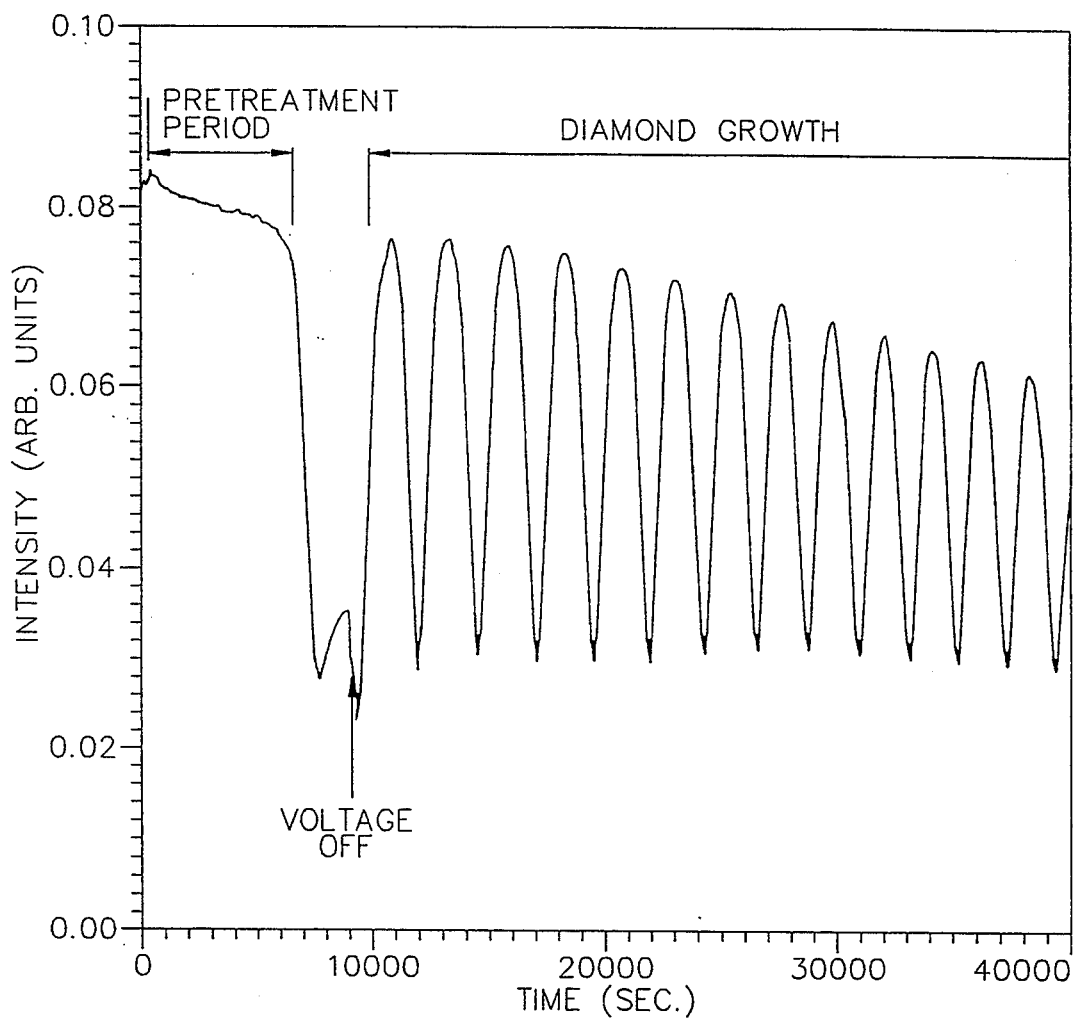
FIG. 2 is a graph showing interference cycles in the reflected intensity during diamond film growth corresponding to Example 1.

The diamond films for this example were prepared in an apparatus similar to that shown schematically in FIGS. 1A and 1B. Referring to FIG. 2 there is shown the results of using LRI to monitor the diamond growth rate in the apparatus. The laser light was reflected nearly perpendicular to the substrate and the reflected intensity, monitored via a silicon photodiode, was recorded by a computer. The helium-neon laser ($\lambda=630$ nm) corresponded to 0.13 $\mu$m film growth per intensity cycle in the case of a high quality diamond film having $\eta=2.4$. Several initial calibration runs were performed with methane percentages ranging from 0.5% to 5%. Even in the case of the poorest quality film, the actual thicknesses varied less than 10% for films 1–4 $\mu$m thick, from that measured assuming $\eta=2.4$.

In the present example, the bias voltage to the substrate was approximately $-250$ volts with respect to ground and the current drawn was approximately 100 mA, (between about 75–125 mA) for a 1% by weight methane in hydrogen gas mixture at 15 torr. The optimum period for pretreatment appeared to be approximately 1 to 2 hours.

Figure 3:
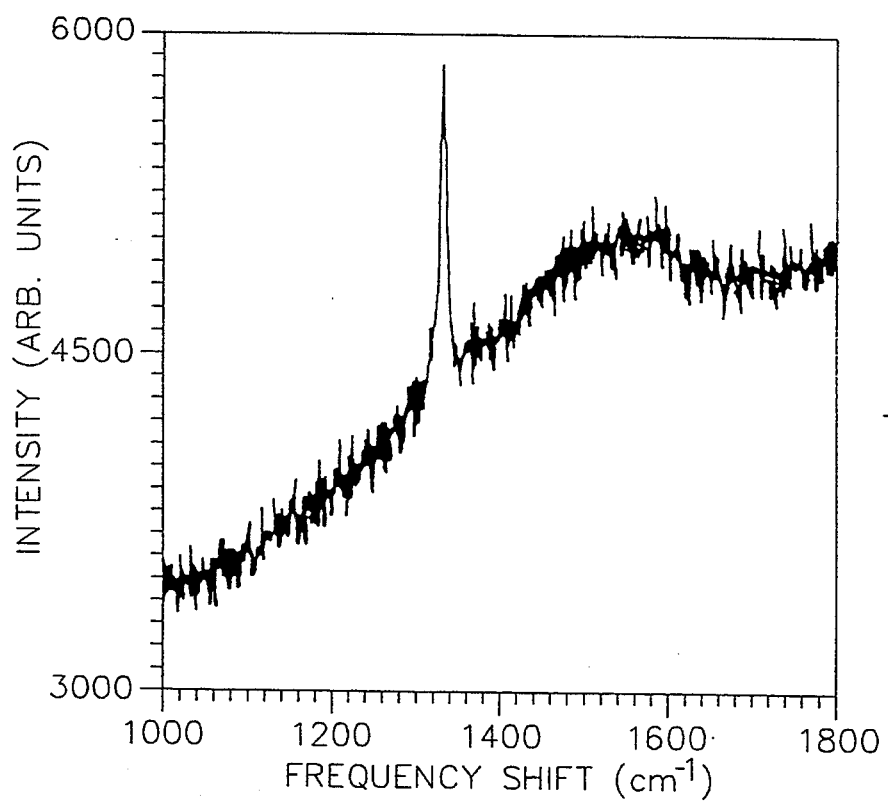
FIG. 3 is a Raman spectra of diamond film growth corresponding to Example 1.
Figure 4A:
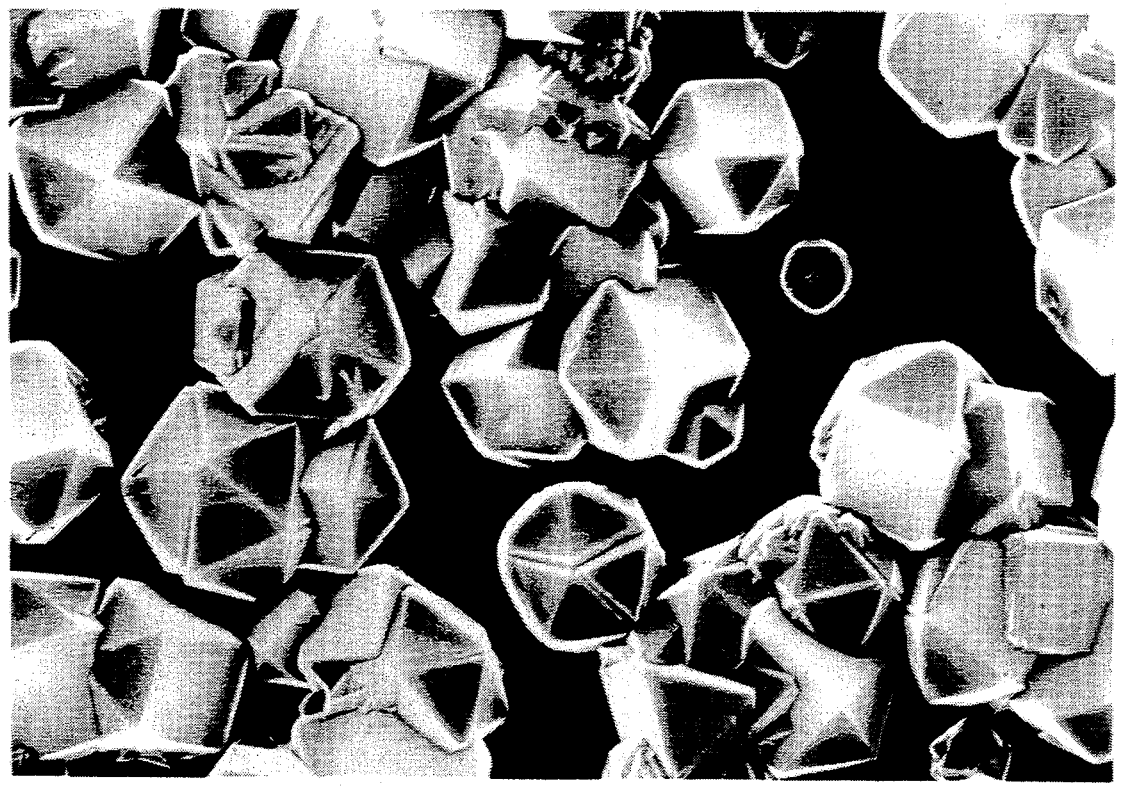
FIG. 4A is an SEM photograph of a silicon substrate pretreated by scratching with 0.25 μm diamond powder prior to diamond deposition as in the prior art.

Both SEM and Raman spectroscopy were used to determine the quality of the diamond grown on the pretreatment film as shown in FIGS. 4A and 3, respectively. The diamond films shown were grown on unscratched silicon substrates at 25 torr in a 1% methane in hydrogen mixture. The total flow rate was 1000 sccm, and the microwave power was about 750 watts.

There appeared to be a relationship between the ion current and the time required to grow an appropriate nucleation film. By visibly decreasing the roughness of the final diamond film surface, the pretreatment method made it possible for LRI to be conducted during growth of the diamond film on an as-received mirror finish silicon substrate for up to 60 hours of diamond growth.

EXAMPLE 2

Figure 4B:
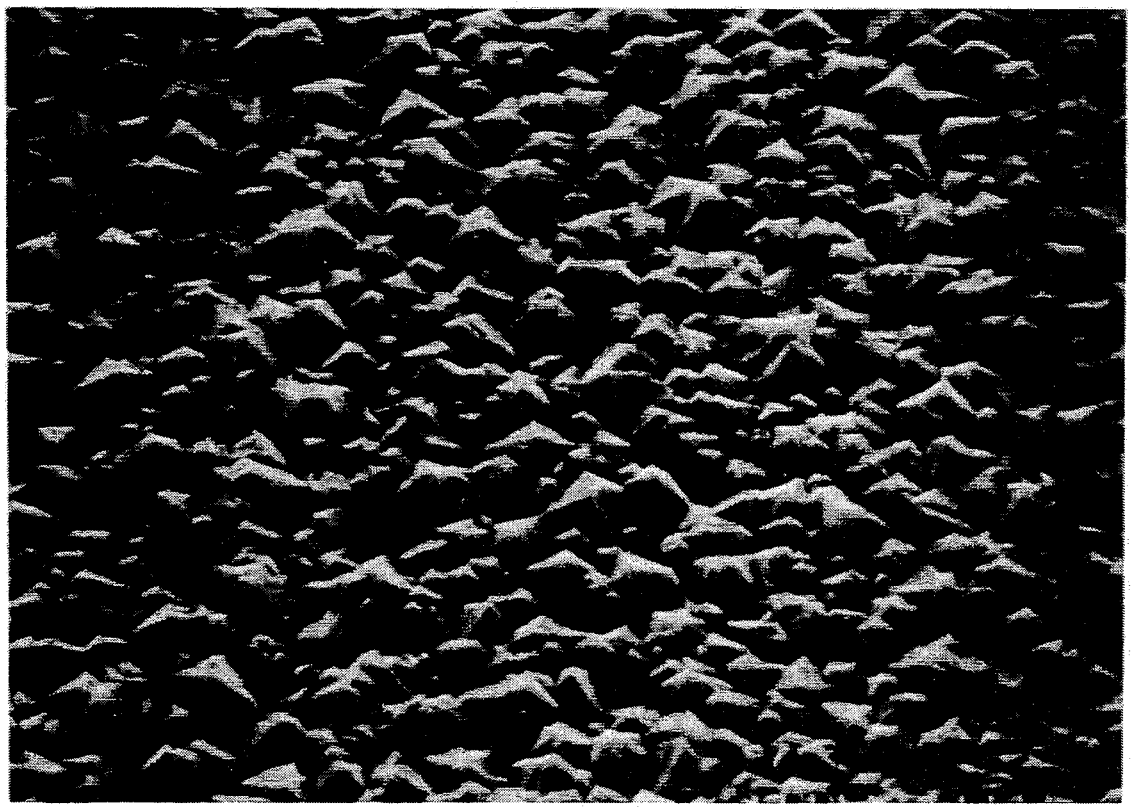
FIG. 4B is an SEM photograph of a silicon substrate pretreated according to the method of the present invention corresponding to Example 2.

In this example, a processing apparatus similar to that shown schematically in FIGS. 1A and 1B was used to grow a diamond film onto a pretreated silicon substrate. FIG. 4B shows a substrate pretreated according to the present invention with a diamond film grown thereon. The substrate was electrically biased at $-250$ volts with respect to ground, and immersed in a 2% methane in hydrogen plasma for 1 hour. The total flow rate was 1000 sccm, the net microwave power was maintained at 600 watts and the pressure was 15 torr. The thus pretreated substrate was then grown on for 5 hours using conventional CVD techniques.

Figure 5:
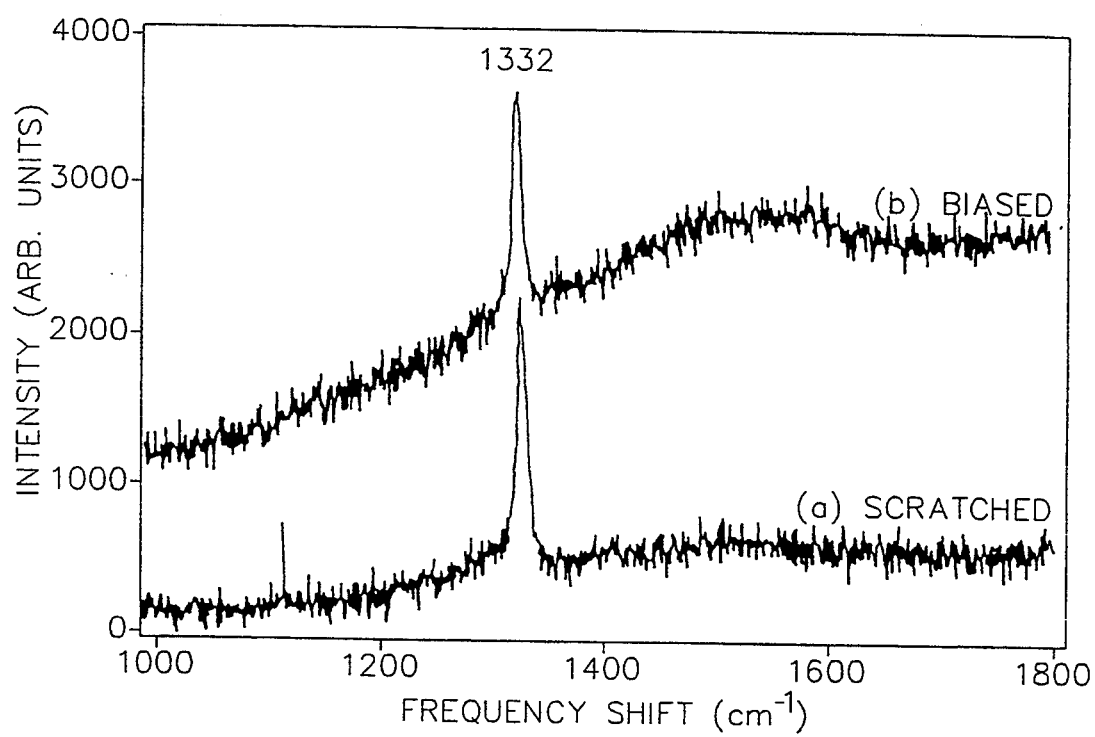
FIG. 5 is Raman spectra of the pretreated silicon substrate as shown in FIG. 4A and the scratched substrate as shown in FIG. 4B.

FIG. 4A, in comparison, shows a silicon substrate that was scratched with 0.25 $\mu$m diamond paste, as in the prior art, and then subjected to an identical growth of 5 hours. Raman spectra for both the scratched and pretreated silicon substrates, (a) and (b) respectively, are shown in FIG. 5. The smaller diamond peak (1332 cm$^{-1}$) and larger background observed from the pretreated sample is indicative of a film with a higher nucleation density and a larger number of grain boundaries.

Pretreated substrates were found to have a nucleation density of up to $10^{11}$/cm$^2$ depending on the length of the pretreatment time. This contrast with the scratched substrate density of $10^7$/cm$^2$ or a pristine substrate nucleation density of only about $10^4$/cm$^2$. Thus, four orders of magnitude improvement in nucleation density was achieved by pretreatment over scratched samples, and the resulting diamond films formed on the pretreated substrates showed better thickness uniformity and lower surface roughness.

EXAMPLE 3

In this example a processing apparatus similar to that shown schematically in FIGS. 1A and 1B was used along with other conventional measuring devices and techniques. In this example, results were obtained which indicate that nucleation density of a diamond film may be controlled over five orders of magnitude by altering the electrical bias pretreatment time. As would readily be appreciated by those skilled in the art, the ability to so control nucleation density by controlling only a single processing parameter has many advantages.

A series of pretreatments were interrupted at set intervals and then the substrate was analyzed in-vacuo to observe the corresponding changes in surface chemistry to systematically observe the nucleation process. Table 2 below outlines the measurements performed for this pretreatment series.

TABLE 2

| Bias Time (min/hrs) | Analysis Performed | | | | |
|---|---|---|---|---|---|
| | XPS/AES | XPS-EELS | Raman | SEM | TEM |
| Before Bias | X | | | | |
| 1 min. | X | | | | |
| 5 min. | X | X | | | |
| 15 min. | X | X | | | |
| 30 min. | X | X | | X | |
| 1 hr. | X | X | | X | |
| 1.5 hrs. | X | X | X | X | |
| 2.0 hrs. | X | X | X | X | |

One centimeter square samples were prepared from undoped silicon substrates. They were ultrasonically cleaned in trichloroethylene (TCE), acetone, methanol, 2-Propanol and the rinsed in deionized (DI) water. Just prior to insertion into the processing apparatus, they were dipped for 1 minute into a 1:10 mixture of hydrofluoric acid in DI water to remove any existing native oxide, rinsed in DI water and then blown dry with nitrogen. This procedure was to ensure minimal surface oxidation and hydrocarbon contamination on each of the samples.

The substrates were electrically biased at 250 volts negative with respect to ground, immersed in a 2% methane-in-hydrogen plasma. The total flow rate was 1000 sccm, the net microwave power was maintained at 600 watts and the pressure was 15 torr. Individual samples were biased for 1, 5, 15, 30, 60, 90 and 120 minutes. The plasma and electrical bias were then shut off, the chamber was evacuated to $10^{-7}$ torr, and the sample was subsequently transferred to a surface analytical chamber. In the analytical chamber, XPS, SPS-EELS and AES were performed on each sample. An as-inserted sample was also analyzed to observe the chemical species present on the surface before pretreatment was initiated.

Figure 6A:
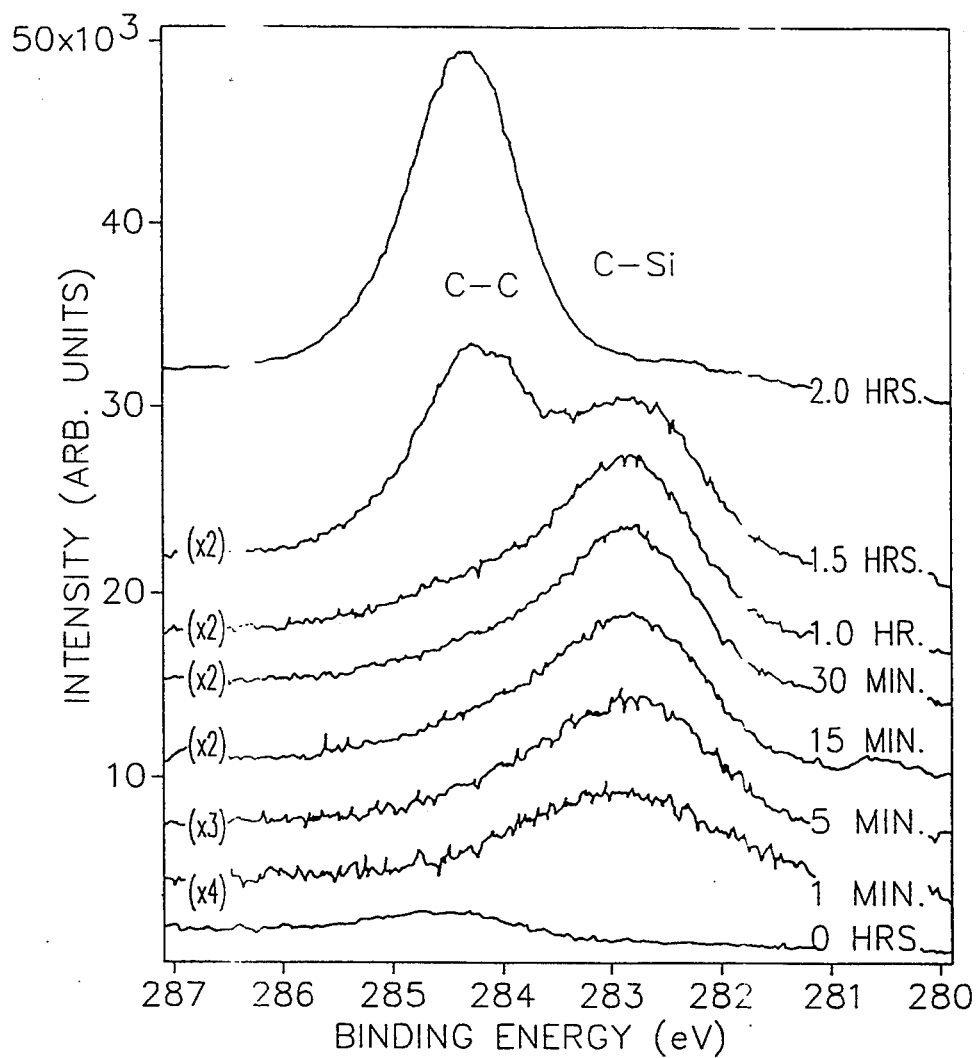
FIGS. 6A and 6B are XPS analyses as a function of bias pretreatment time showing the C-1s and Si-2p peak progressions, respectively, corresponding to Example 3.

FIG. 6A shows the carbon 1s (C-1s) core level peak observed using XPS, as a function of electrical bias time of which the quantitative analysis is shown below in Table 3.

TABLE 3

| Bias Time (min. or hrs.) | Carbon 1s Peak Ratios C—C:Si—C | Silicon 2p Peak Ratios Si—Si:Si—C: (Si—O) | Concentration Ratios (C:Si) |
|---|---|---|---|
| 0.0 hrs. | ($C_xH_yO_z$) | 100:0 | 16:84 |
| 5 min. | 22:78 | 44:43:(13) | 26:74 |
| 15 min. | 22:78 | 26:74 | 32:68 |
| 30 min. | 20:80 | 20:80 | 33:67 |
| 1 hr. | 20:80 | 1:99 | 37:63 |
| 1.5 hrs. | 54:46 | 12:88 | 48:52 |
| 2.0 hrs. | 90:10 | 11:89 | 92:08 |

The silicon substrate was found to have a small amount of carbon contamination on it before electrical biasing began. This carbon contamination was found to be either removed or converted into SiC in the first 5 minutes of biasing. From 5 minutes to 1 hour, the majority of the carbon on the surface has a binding energy of 282.8 eV and is assigned to Si-C bonding. Deconvolution of the C-1s peaks show that a smaller peak, approximately 20% exists at 284.3 Ev characteristic of C—C bonding. The origin and structure of this excess C—C bonding is unclear as is its effect on the nucleation density. Since XPS core level shifts can only give chemical bonding information, they are not capable of distinguishing between diamond, graphite and amorphous carbon.

It is unlikely that the C—C peak represents diamond since such a large difference in nucleation density is observed for biases of 5 minutes to 1 hour. The fact that the relative percentage of this peak to the total C-1s is fairly constant at 20% for 5 minutes to 1 hour, leads applicants to theorize without wishing to be bound thereto, that the carbon could be on the surface of the film. A post biasing sputter with argon in the processing apparatus was successful in removing the C—C resulting in a single Si-C peak at 282.8 Ev, thus confirming that the carbon was confined to the surface. Applicants further theorize that the small amount of carbon is caused by the biasing process, such as excess etching or sublimation of the Si from the SiC, or the increased flux of hydrocarbon ions to the surface.

Figure 6B:
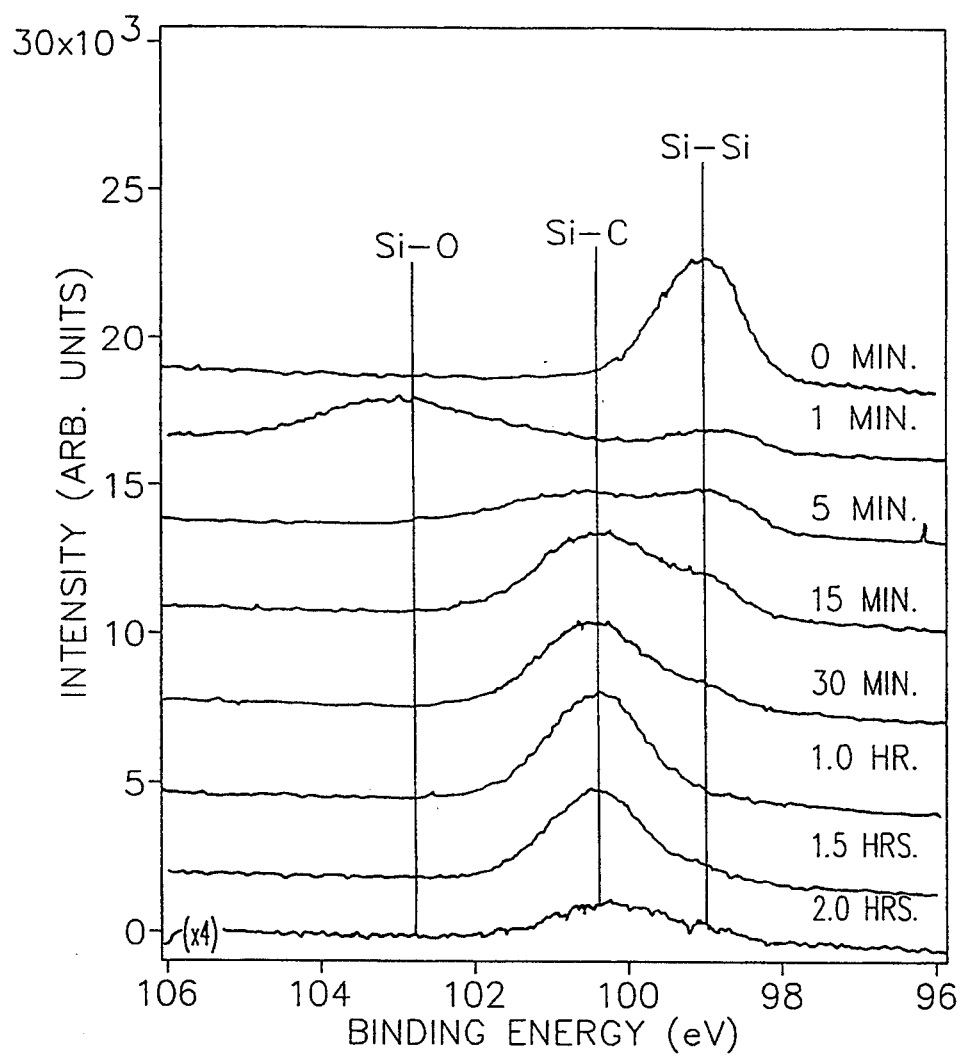

The Si-2p peak shown in FIG. 6B was used to observe the chemical transformation of the silicon substrate as a function of bias time. Before biasing begins, there exists only a single peak at 99.0 Ev, which is representative of elemental silicon. After just 1 minute of biasing, a majority of the silicon observed has been converted into silicon oxide (102.7 eV). By 15 minutes of biasing, however, the oxide has been totally removed and the resulting peak is a mixture of elemental silicon (99.0 eV) and Si-C (100.3 eV). From 15 minutes to 1 hour, the Si-C peak steadily increases to nearly 100%, suggesting that it is covering the silicon substrate. At 1.5 hours, corresponding to the sharp increase in C-1s peak at 284.3 eV (FIG. 6A) there is a reemergence of the elemental silicon signal at 99.0 eV. This suggests that etching of the interfacial Si-C film may be occurring thereby bringing Si closer to the surface and causing an increase in the Si signal. By 2 hours, the C-1s peak shows over 90% C—C bonding, and the carbon-to-silicon ratio is up to over 90% as well, indicating that the surface is nearly covered with some elemental form of carbon shown to be diamond by AES, XPS-EELS, and Raman spectroscopy as explained below.

The XPS series showed that a SiC film develops before the surface becomes covered with the elemental form of carbon. Overlayer calculations were used to determine the approximate thickness of this film as a function of bias time. Calculations are based on an inelastic electron mean free path of 20 Å, and assume a layer-by-layer growth model of the SiC overlayer for simplicity. The results of these calculations are shown below in Table 4.

TABLE 4

| Bias Time (min. or hrs.) | Si—C film Thickness (Å) | C—C (Å) | Si—O (Å) |
|---|---|---|---|
| 0.0 hrs. | — | 4 | 0 |

TABLE 4-continued

| Bias Time (min. or hrs.) | Si—C film Thickness (Å) | C—C (Å) | Si—O (Å) |
|---|---|---|---|
| 5 min. | 12 | 6 | 4 |
| 15 min. | 27 | 8 | 0 |
| 30 min. | 32 | 8 | 0 |
| 1 hr. | 90 | 9 | 0 |
| 1.5 hrs. | 42 | (Diamond) | 0 |
| 2.0 hrs. | 44 | (Diamond) | 0 |

Before biasing, there exists a clean silicon substrate with approximately 4 Å of the amorphous and hydrogenated carbon on the surface. From 5 minutes to 1 hour, the carbide thickness climbs from approximately 10 to 90 Å while the carbon increases slightly from 5 to 10 Å. At 1.5 hours, concurrent with the observed increase in the elemental silicon peak, the carbide thickness drops drastically back down to approximately 45 Å, and remains relatively unchanged by 2 hours.

It should be noted that the layer-by-layer approximation used above may result in a lower calculated value for the interfacial carbide thickness than has actually occurred. If the carbide film at 1 hour had a uniform thickness of 90 Å and the subsequent etching was nonuniform, that is, island-like, then the actual average thickness would be higher than the 45 Å calculated above. There would still be a decrease in the overall thickness from 1 hour to 1.5 hours, yet not quite as drastic as estimated.

Figure 7A:
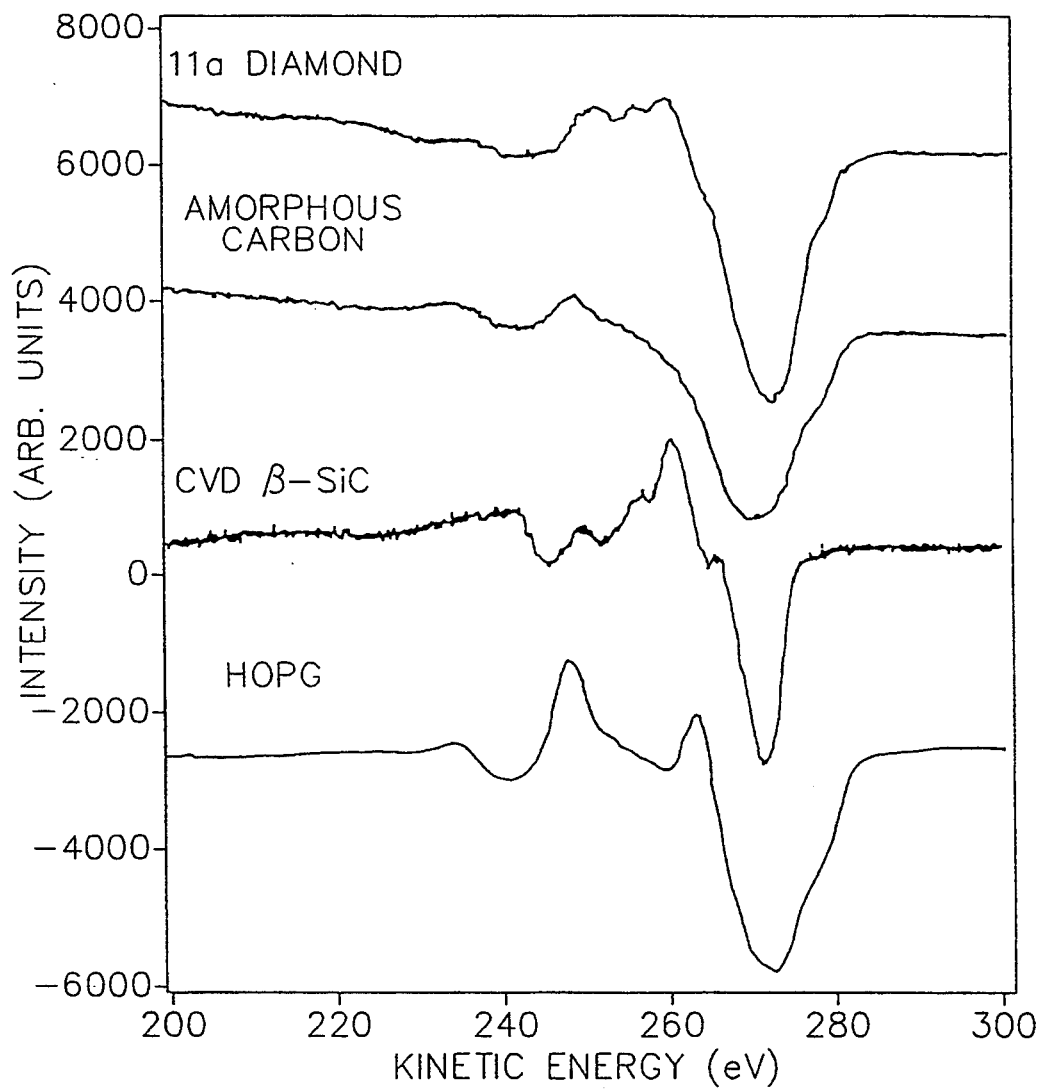
FIGS. 7A and 7B are an AES and XPS-EELS spectra, respectively, from single crystal diamond, amorphous carbon, single crystal SiC, and highly ordered pyrolytic graphite (HOPG), corresponding to Example 3.
Figure 7B:
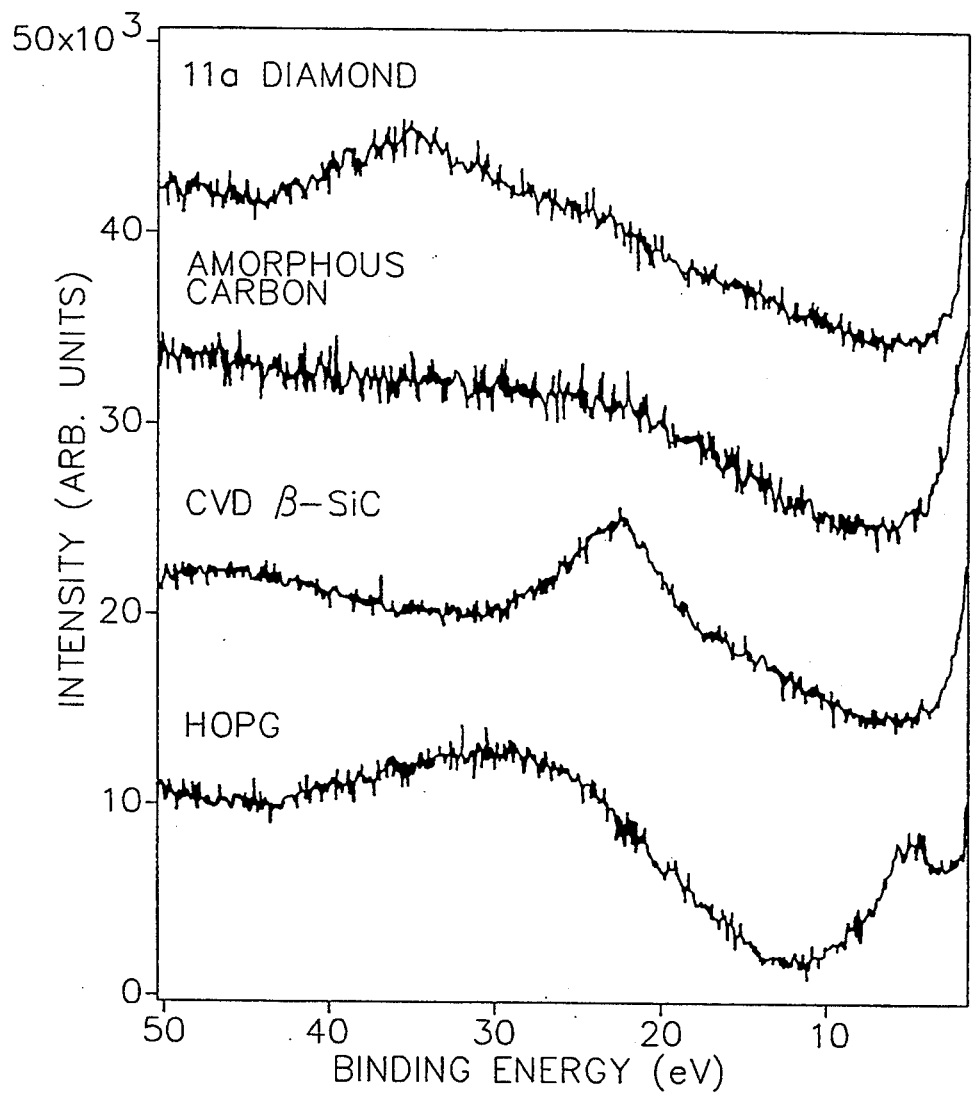
Figure 8A:
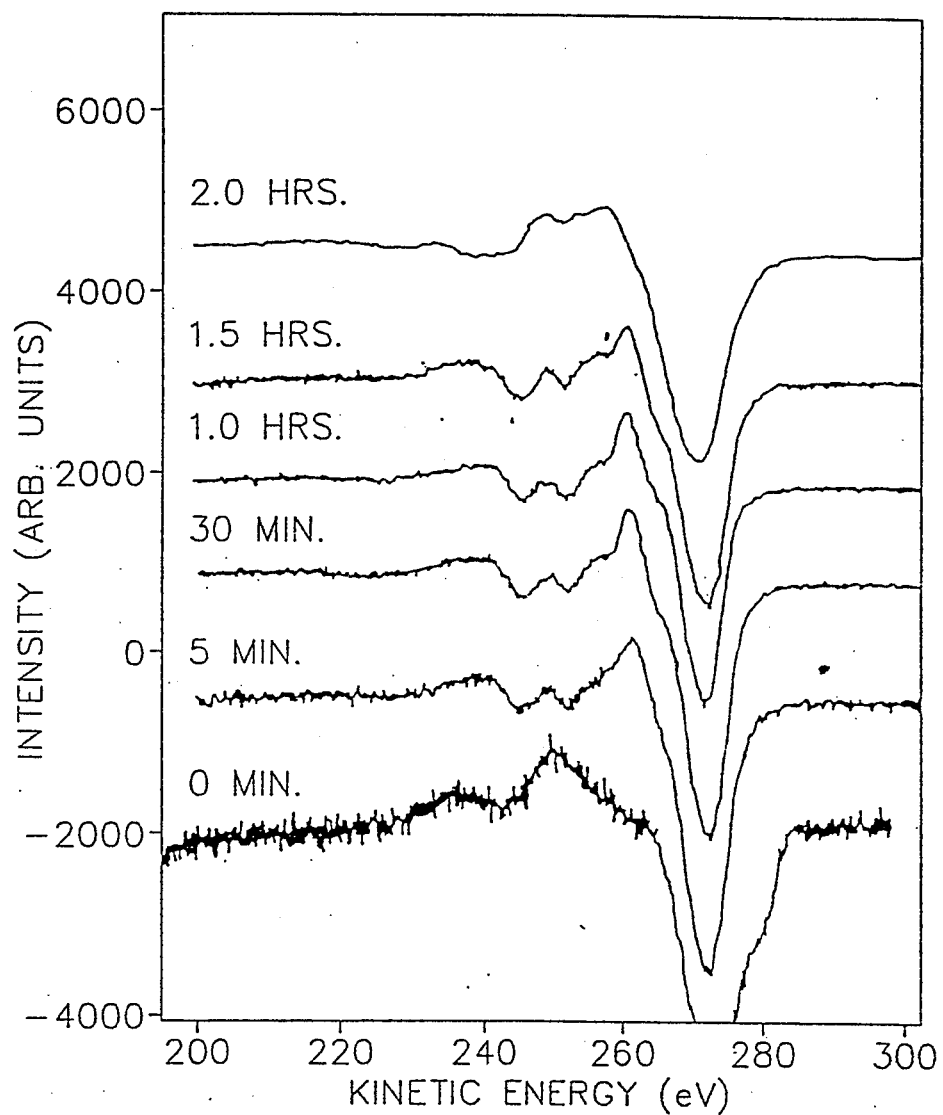
FIGS. 8A and 8B are an auger electron spectra and XPS-EELS, respectively, taken at various bias times corresponding to Example 3.

Since the XPS core level shifts can only provide chemical bonding information, C-EELS and AES were used to help provide information as to the crystalline structure of the different forms of carbon observed on the surface during the series. FIGS. 7A and 7B both show standard AES and XPS-EELS spectra, respectively, taken from natural type IIA diamond, sputtered amorphous carbon, SiC, and highly ordered pyrolytic graphite (HOPG). The AES bias time series shown in FIG. 8A shows a transition from the hydrogenated and amorphous carbon that exists on the surface before biasing begins to a fine structure resembling SiC by 15 minutes, then to one resembling diamond by 2 hours of biasing. There is a subtle change from the 1 hour bias sample to the 1.5 hour case.

Figure 8B:
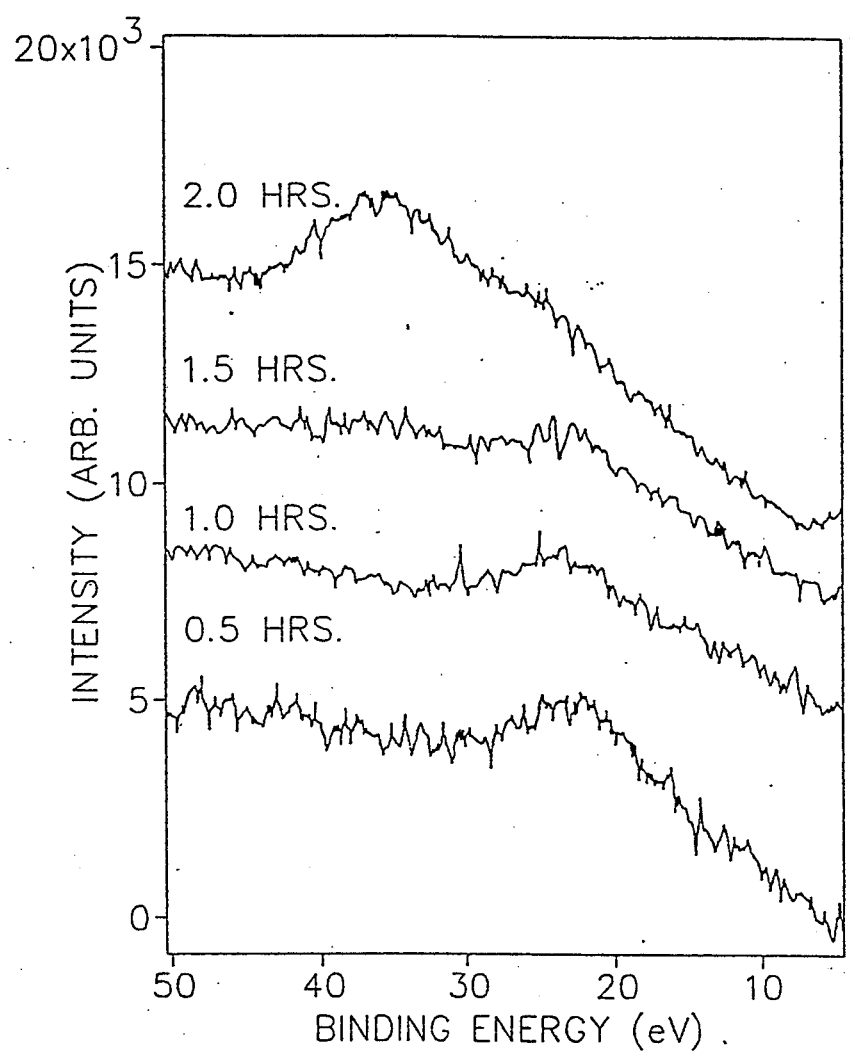

From the XPS-EELS data shown in FIG. 8B, the transition from SiC to diamond is much more evident. From the standards shown in FIG. 7B, SiC has a characteristic bulk plasmon peak at 23 eV and diamond has both bulk and surface plasmon peaks at 35 eV and 25 eV respectively. As shown, at 0.5 hours, the spectra clearly resembles that of SiC, with a single bulk plasmon peak at 23 eV, and at 2 hours resembles diamond with both bulk and surface plasmon peaks at 35 eV and 25 eV respectively. However, at 1.5 hours the spectra is a clear mixture of both diamond and SiC, thus suggesting that some diamond is present on the surface after 1.5 hours of biasing.

Based upon this data, applicants theorize without wishing to be bound to the theory, that the sharp rise in the C-1s peak at 284.3 eV after 1.5 hours of bias as shown in FIG. 6A was due to increase in the number of diamond nuclei on the surface. In addition, in the spectra for the carbon XPS-EELS, no peak at 6 eV off of the core level was observed, thus suggesting that graphite was not present on the surface throughout the biasing, at least within the sensitivity limits of the measurement technique.

Figure 9:
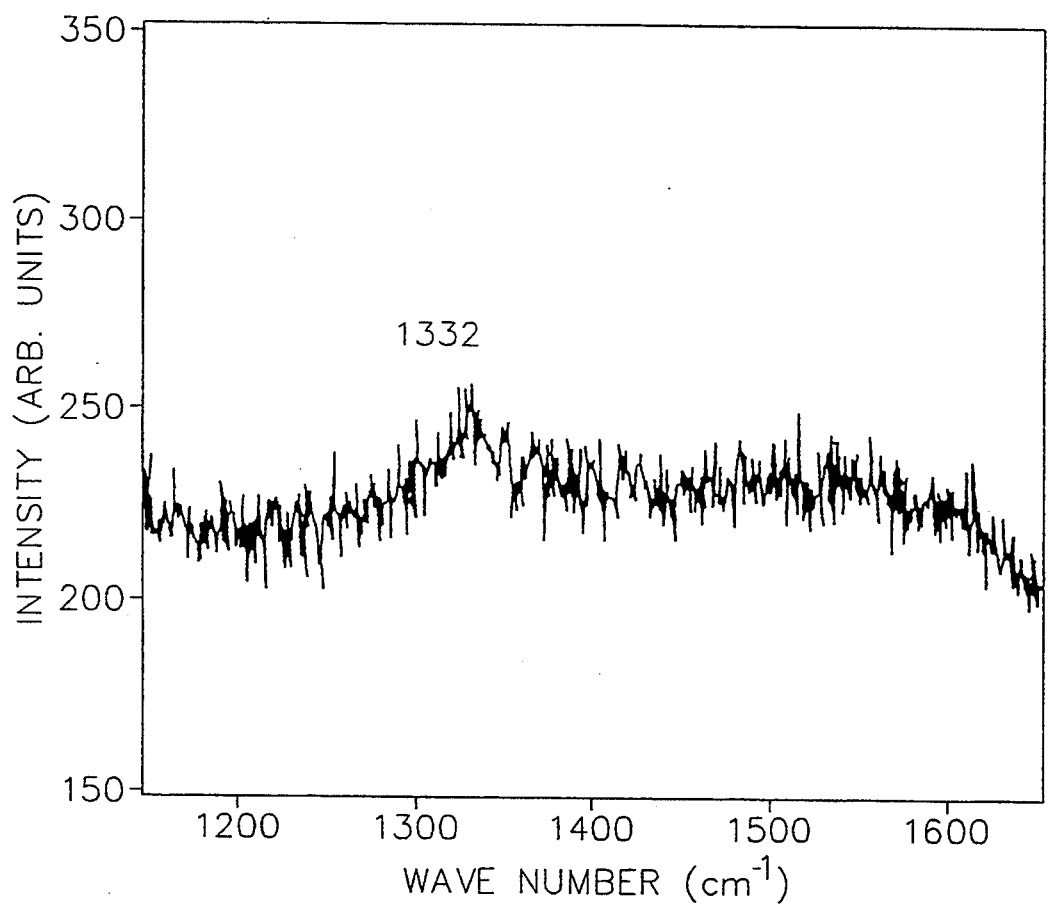
FIG. 9 is a Raman spectra from a sample after 2 hours of bias pretreatment corresponding to Example 3.

To further demonstrate that the carbon observed after 1.5 and 2 hours of bias was diamond, Raman spectroscopy was performed. Due to the relatively low cross-section for diamond, 10 scans were performed and then subsequently superimposed in order to improve the signal-to-noise ratio. The carbon concentration on the 1.5 hour sample was still too low to observe with this technique, however, the 2 hour sample did produce a small characteristic diamond peak at 1332 $cm^{-1}$, as shown FIG. 9. No graphitic peaks were observed near 1580 $cm^{-1}$. Since graphite has about a 50 times higher Raman cross-section than does diamond, it is highly improvable that the diamond could have nucleated on graphite. If so, a Raman peak at 1580 $cm^{-1}$ would have been observed for a nucleation density as high as obtained here.

Figure 10A:
FIGS. 10A, 10B and 10C are SEM photographs of a sample after a bias pretreatment after 1 hour, 1.5 hours, and 2 hours, respectively, corresponding to Example 3.
Figure 10B:
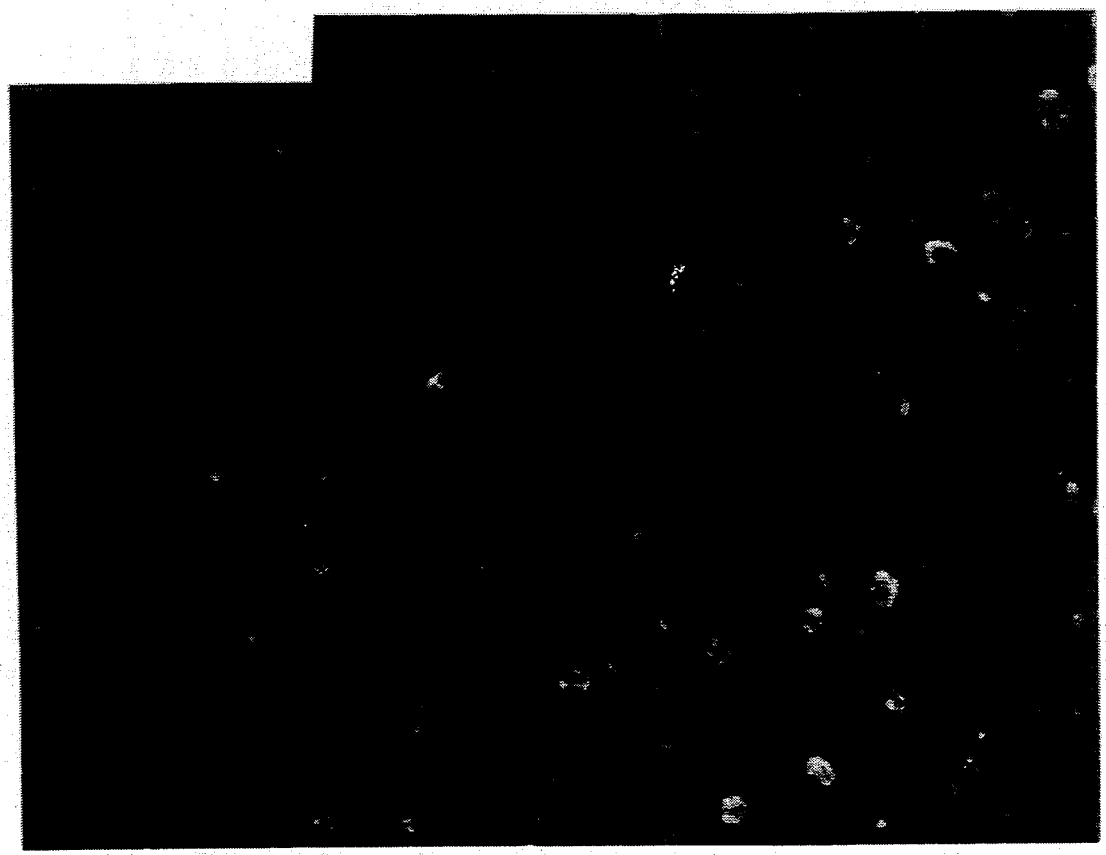
Figure 10C:
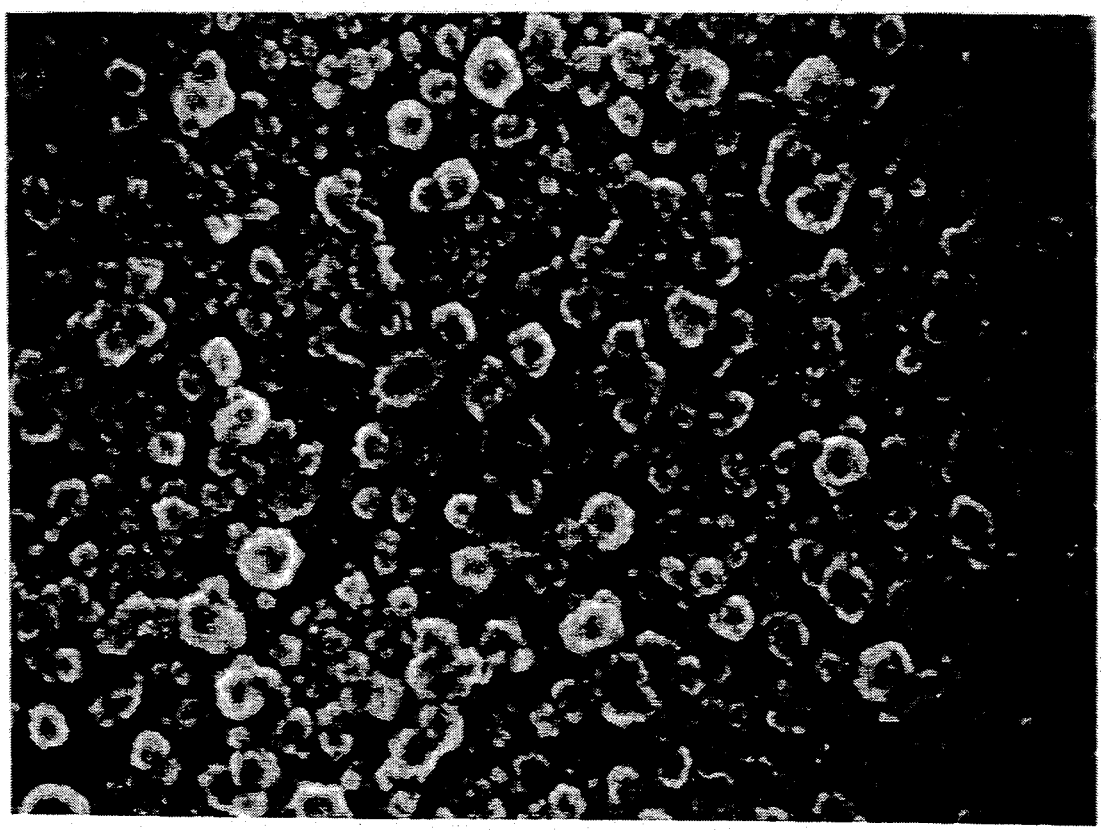
Figure 11:
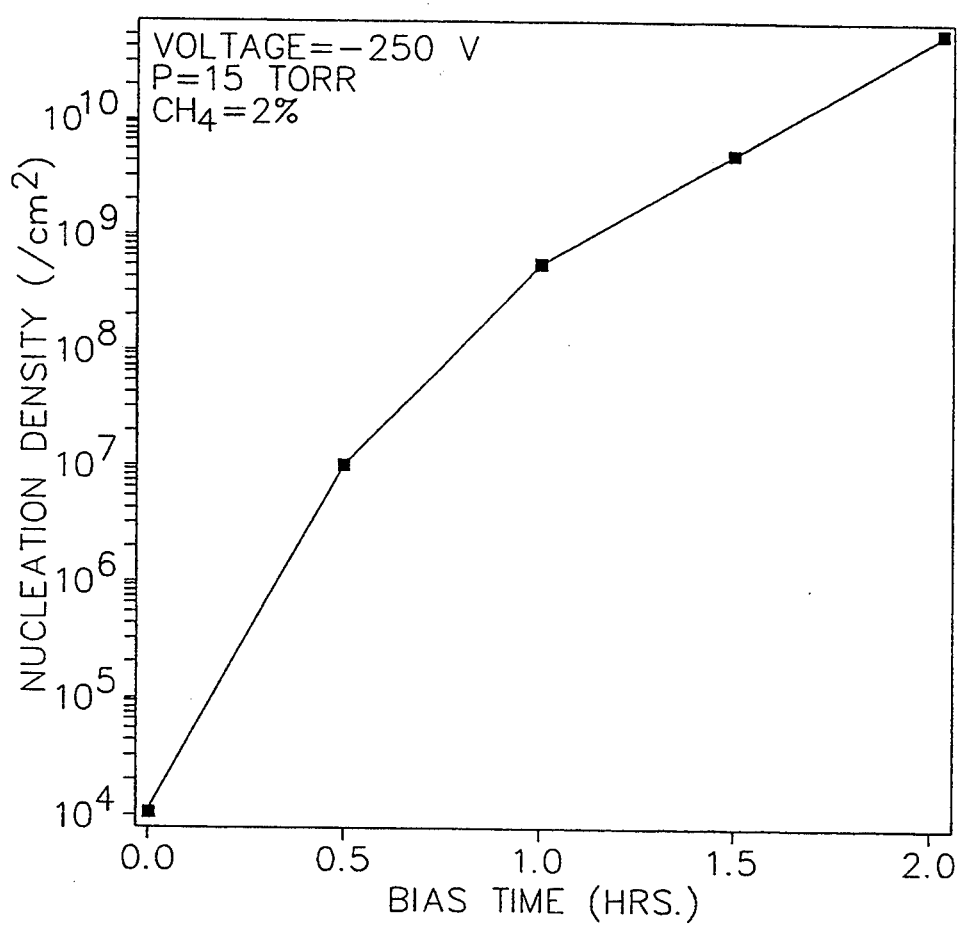
FIG. 11 is a graph of nucleation density as a function of bias pretreatment time corresponding to Example 3.

As shown in FIGS. 10A–10C, SEMs were also taken at 1 hour (FIG. 10A), 1.5 hours (FIG. 10B), and 2 hours (FIG. 10C) bias to see if the diamond could be observed. The 2 hour sample of FIG. 10C showed that the surface was about 90% covered with diamond particles ranging in size from 10 to 60 nm in diameter as measured within the resolution of the Hitachi H-5000 field emission microscope. The nucleation density from the 2 hour sample was observed to be about $5 \times 10^{10}/cm^2$ since particles less than 10 nm could not be observed with the microscope used. The 1.5 and 1 hour samples showed decreasing nucleation densities of about $5 \times 10^9$ and $5 \times 10^8/cm^2$ respectively. The 30 minute sample had a very small number of observable nuclei present making it difficult to obtain an accurate measure of nucleation density. Therefore, nucleation density for the 30 minute sample was determined based upon a 10 hour growth on the 30 minute bias pretreatment that produced an approximately 75% complete diamond film and that yielded a density of $1 \times 10^7/cm^2$. FIG. 11 shows a graph of nucleation density versus bias time. From this data it would be readily understood by those skilled in the art that the nucleation density could be controlled by over 6 orders of magnitude by controlling the bias pretreatment time alone.

Data from the AES, XPS-EELS, Raman and SEM all suggest and self-consistently confirm that diamond is nucleating during the biasing pretreatment. Diamond particles may be observed by SEM at as early as 30 minutes of biasing. Nucleation continues for up to 2 hours, at which time the surface is nearly covered with nuclei no larger than 80 nm in diameter. This confirms that the biasing pretreatment is actually creating the diamond nuclei, as composed to just creating sites that are favorable for diamond nucleation. If the bias pretreatment is continued long after the nominal 2 hour period, a much poorer quality diamond film results, thus suggesting that conditions favorable for nucleation are not so for diamond growth.

EXAMPLE 4

In the series of experiments for this example, an apparatus similar to that illustrated in FIGS. 1A and 1B was used. Table 5 below outlines the experiments and analyses performed in this example.

TABLE 5

| Bias/Growth Time (min/hrs) | Analysis Performed | | | |
|---|---|---|---|---|
| | XS/AES | XPS-EELS | Raman | SEM | TEM |
| 1.0/0.0 | X | X | | X | |
| 1.0/0.75 | X | X | | | |

TABLE 5-continued

| Bias/Growth Time (min/hrs) | Analysis Performed | | | | |
|---|---|---|---|---|---|
| | XS/AES | XPS-EELS | Raman | SEM | TEM |
| 1.0/1.0 | X | X | | X | |
| 1.0/2.0 | X | X | | X | |
| 1.0/5.0 | X | X | X | X | X |

The substrates were prepared identically to those in the preceding example. The substrates were then pretreated as described in the preceding example for 1 hour. At the end of pretreatment, the electrical biasing was discontinued, the methane concentration was reduced to 1% at 1000 sccm of hydrogen, the pressure was increased to 25 torr and the substrates were repositioned to a distance of 0.5 cm from the plasma. Diamond film samples were then grown on these pretreated substrates for 0.75, 1, 2, and 5 hours. The results from the surface analysis for this series are summarized in Table 6 below.

TABLE 6

| Bias/ Growth Time (hrs./hrs.) | Carbon 1s Peak Ratios C—C:Si—C | Silicon 2p Peak Ratios Si—Si:Si—C:(Si—O) | Concentration Ratios (C:Si) |
|---|---|---|---|
| 0.0/0.0 | $(C_xH_yO_z)$ | 100:0 | 16:84 |
| 0.08/0.0 | 22:78 | 44:43:(13) | 26:74 |
| 0.25/0.0 | 22:78 | 26:74 | 32:68 |
| 0.5/0.0 | 20:80 | 20:80 | 33:67 |
| 1.0/0.0 | 20:80 | 1:99 | 37:63 |
| 1.0/0.75 | 43:57 | 10:90 | 35:65 |
| 1.0/1.0 | 50:50 | 14:86 | 41:59 |
| 1.0/2.0 | 76:24 | 35:65 | 52:48 |
| 1.0/5.0 | 100:0 | — | 100:0 |

Figure 12A:
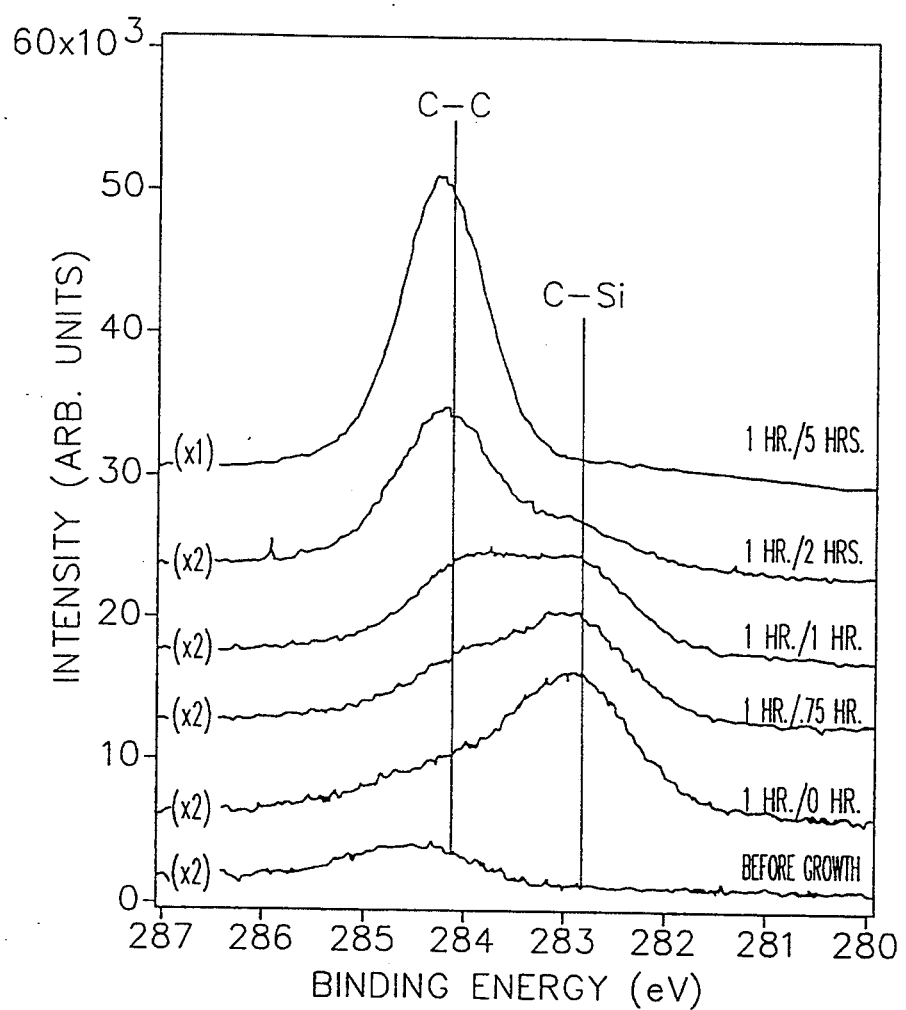
FIGS. 12A and 12B are XPS at various times for C-1s and Si-2p peak progressions, respectively, corresponding to Example 4.
Figure 12B:
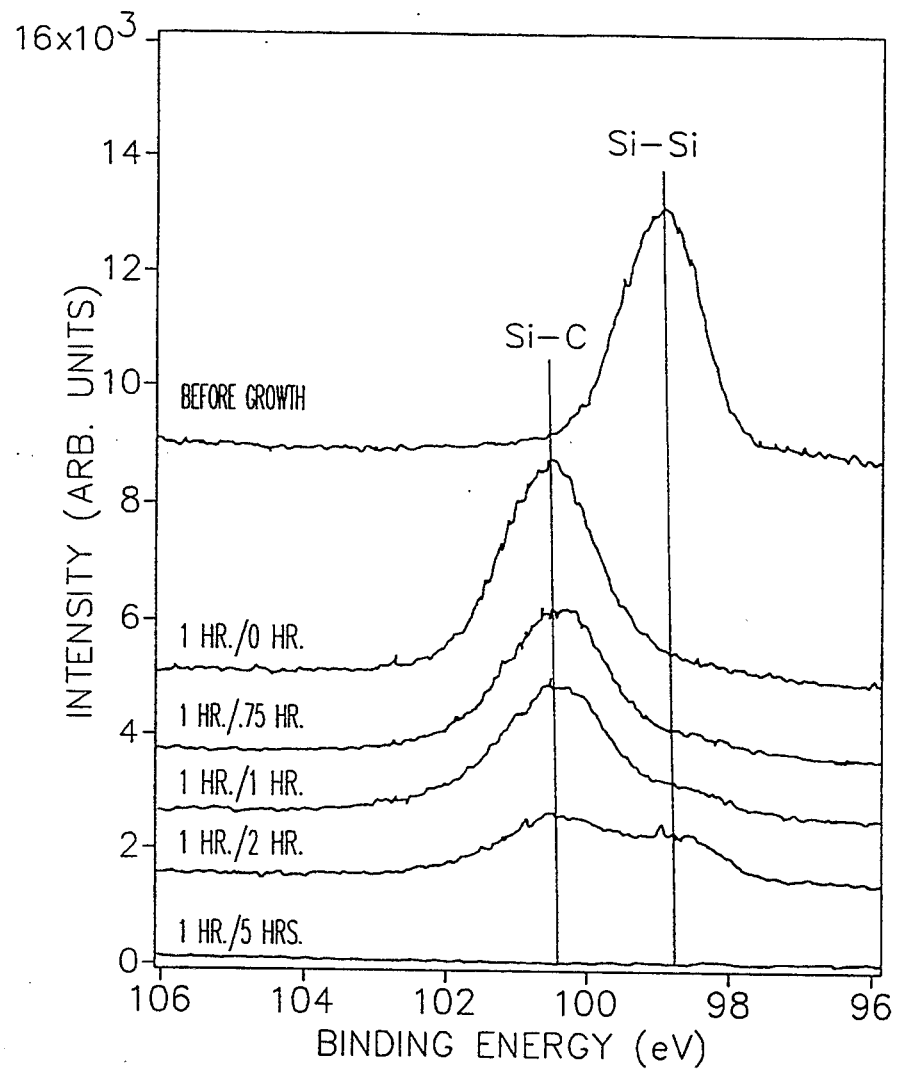

From observing the C-1s peak as a function of growth time as shown in FIG. 12A, a steady increase in C—C bonding (284.3 eV) is shown from when the bias is discontinued and the growth begins, until the substrate is totally covered with diamond at the 5 hour mark. Of special interest is the Si-2p peak in FIG. 12B. When the bias is discontinued at 1 hour, the surface has been almost totally converted to SiC. After just 45 minutes of growth on this surface, the relative contribution of reduced Si to the total Si-2p peak has increased to 10% while the carbon-to-silicon ratio has remained nearly constant. Applicants theorize without wishing to be bound to the theory, that as the individual diamond particles are growing, as indicated by the increase in the C-1s peak at 284.3 eV, that etching of the SiC surface/interfacial film may be exposing silicon from the original substrate. It is not necessary to totally expose the silicon in order to observe it by XPS. Given the theoretical escape depth for silicon, it should still be possible to observe the signal if it is covered by as much as 80–100 Å of SiC. If the SiC is amorphous, the escape depth may be slightly longer. By 2 hours of growth after biasing, the carbon-to-silicon ratio has increased to over 50%, with 76% of the C-1s signal originating from C—C bonding. The contribution from Si-Si bonding to the Si-2p peak has now increased to 35%, further suggesting that etching of the SiC interfacial film may be continuing as the diamond particles continue to grow.

Overlayer calculations, similar to those described in the preceding example, indicate that once the bias is discontinued, the Si-C film begins to diminish rapidly. The interfacial film reduces in average thickness, from 90 Å at the end of biasing, to 40 Å by 1 hour and 20 Å by 2 hours of growth. This data further suggests that the SiC film is being etched, or removed, once significant diamond growth occurs. As mentioned previously, the actual decrease in carbide thickness will not be as sharp if the etching, or removal of the carbide is nonuniform.

Figure 13A:
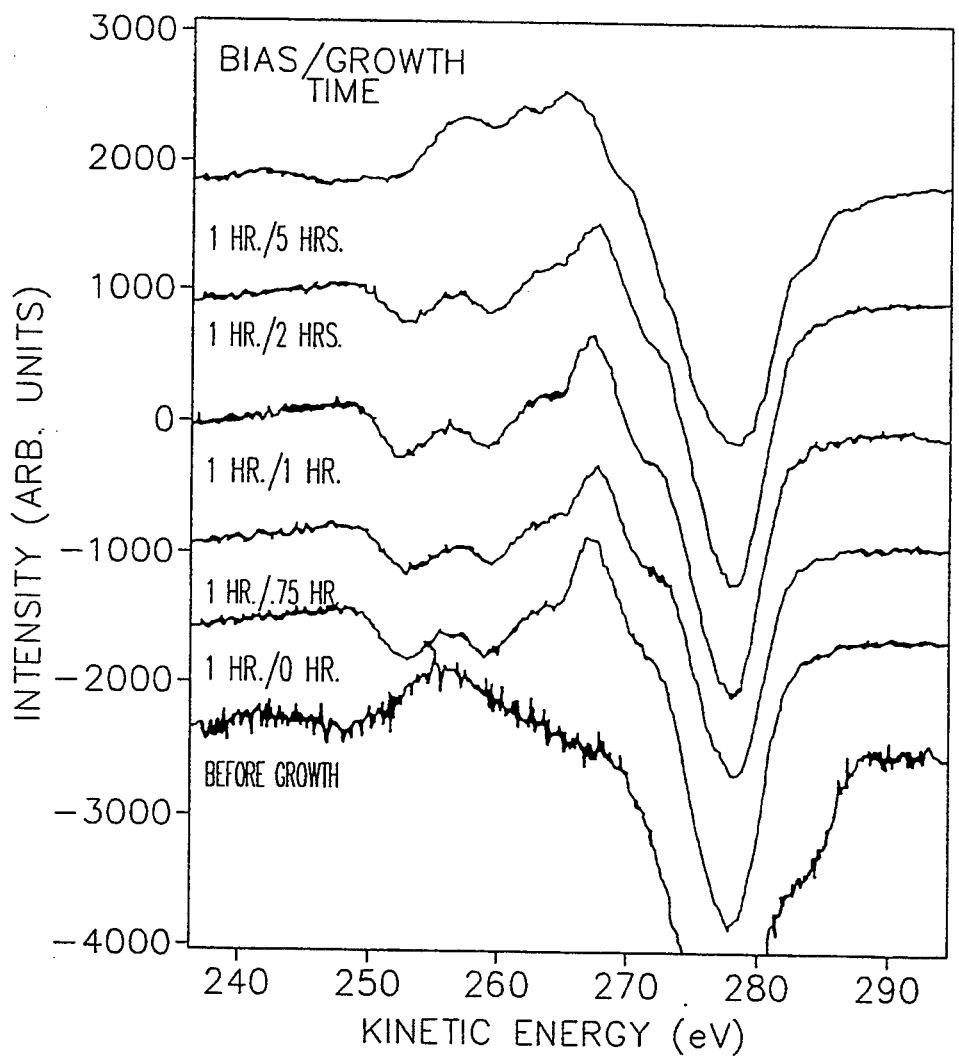
FIGS. 13A and 13B are auger electron spectra and XPS-EELS, respectively, taken at various diamond growth times on a sample pretreated for 1 hour, corresponding to Example 4.
Figure 13B:
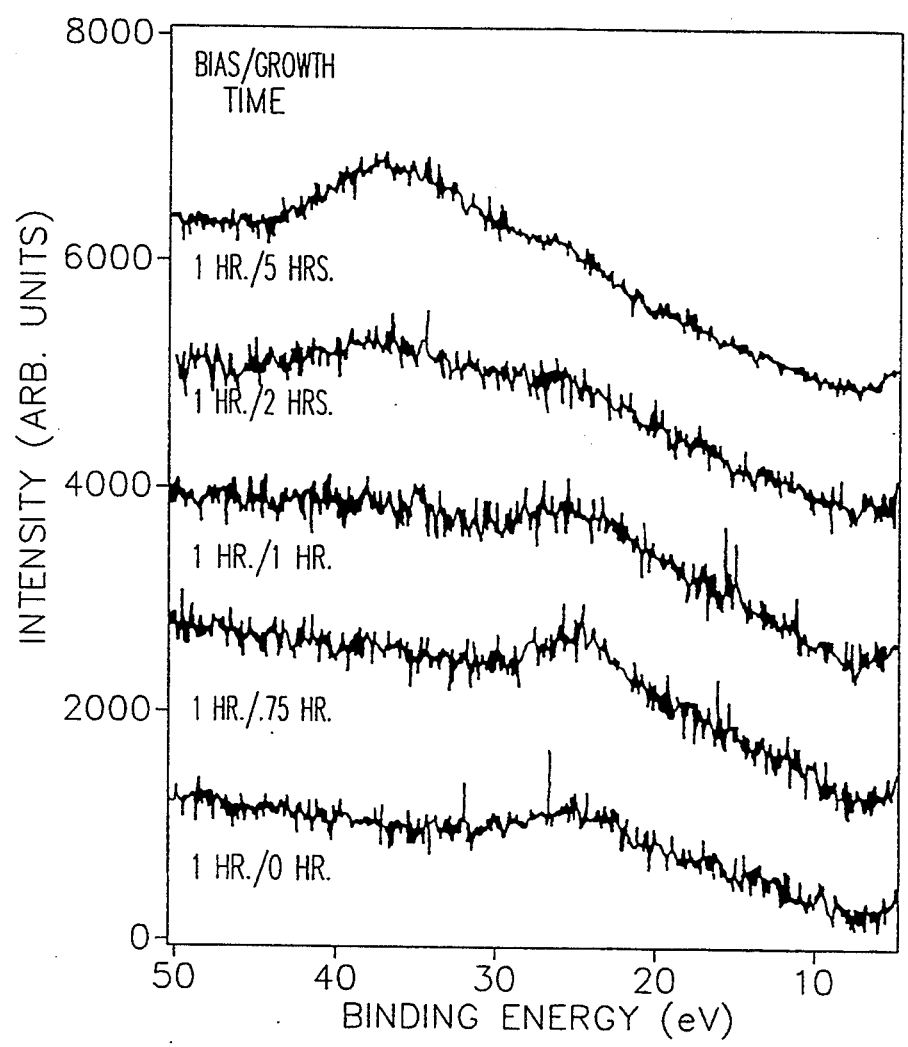
Figure 14A:
FIGS. 14A and 14B are SEM photographs showing a sample after 1 hour bias only and 1 hour growth after a 1 hour bias, respectively, corresponding to Example 4.
Figure 14B:
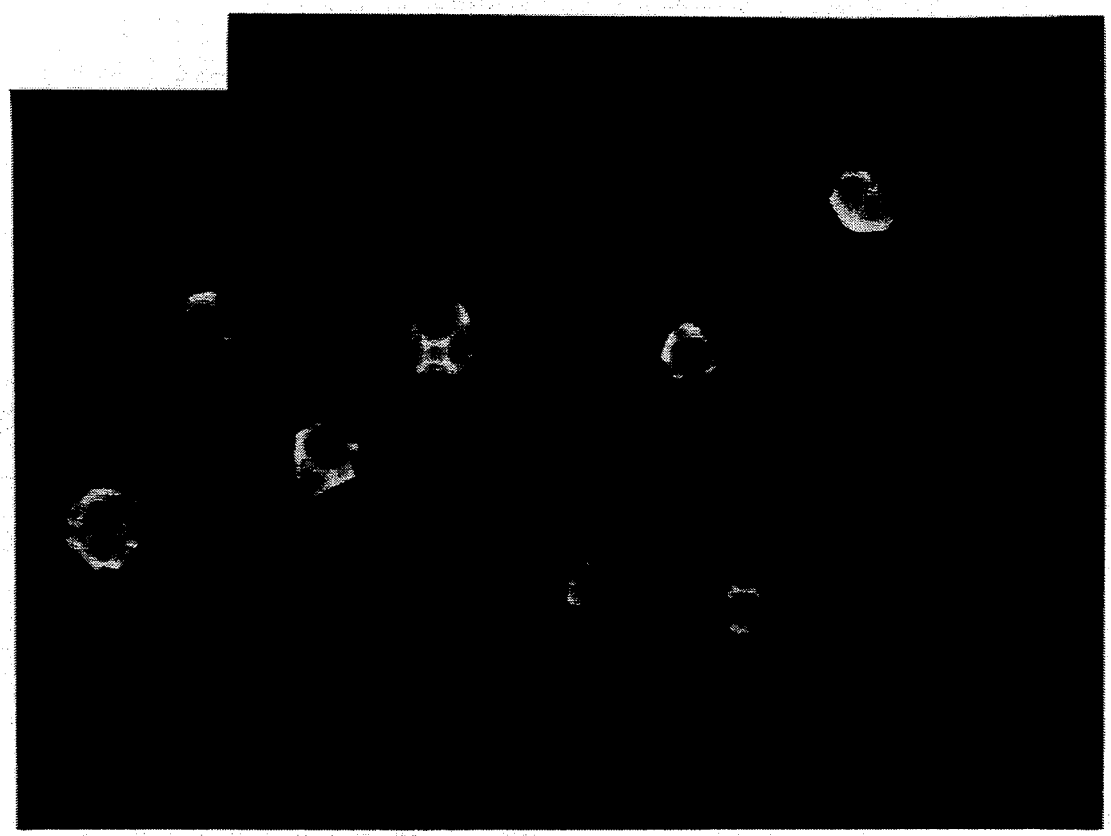

The AES spectra, in FIG. 13A continue to show a strong contribution from the SiC and do not resemble diamond until after 5 hours of growth. The XPS-EELS series on the other hand shows in FIG. 13B that the contribution from diamond begins to become significant by 1 hour of growth, and continues until the film is complete at 5 hours. FIGS. 14A and 14B shown SEM photographs taken from a sample after just the 1 hour pretreatment (FIG. 14A) and after an additional 1 hour of diamond growth (FIG. 14B). The SEMs show that after the bias is discontinued, no more significant nucleation occurs and that the diamond growth continues primarily on the nuclei that existed at the end of the pretreatment period. The nucleation density remains relatively unchanged throughout the growth and average particle diameter increases in size.

It is important to comment on the sensitivity of the XPS-EELS in observing diamond nucleation on, in this case, SiC. Based on the SEMs discussed above for the 1 hour biased sample (FIG. 14B), the nucleation density of diamond particles on the surface was approximately $5 \times 10^8/cm^2$ and they were 10 to 50 nm in diameter. This concentration may be too small to be detected by XPS-EELS. A rough area calculation based on an average particle diameter of 20 nm indicates that the percentage of the sampling area covered by the diamond particles would be only 0.2%. For the sample that was grown for 1 hour after biasing, the average particle diameter is near 100 nm. From this, the average sampling area occupied by the diamond has increased to over 4%. Based on these calculations and the data presented above, the XPS core level measurements are an effective means of determining the amount of specific phases on the surface during the nucleation process, but XPS-EELS may only be used to obtain structural information for surface concentrations in excess of 2–4%.

Thus, from the bias and growth series discussed above, the data suggests that diamond grows primarily on the diamond particles that existed on the surface after the initial biasing pretreatment. SEM micrographs at different post-biasing growth times show that the initial particles just increase in size and develop better crystal habits with time. The discontinuation of nucleation once biasing ceases suggests again that ideal growth conditions may not be favorable for nucleation. As the diamond particles grow, there appears to be etching of the SiC film as suggested by the increase in the Si-Si bonding observed in the XPS Si-2p series.

EXAMPLE 5

Figure 15:
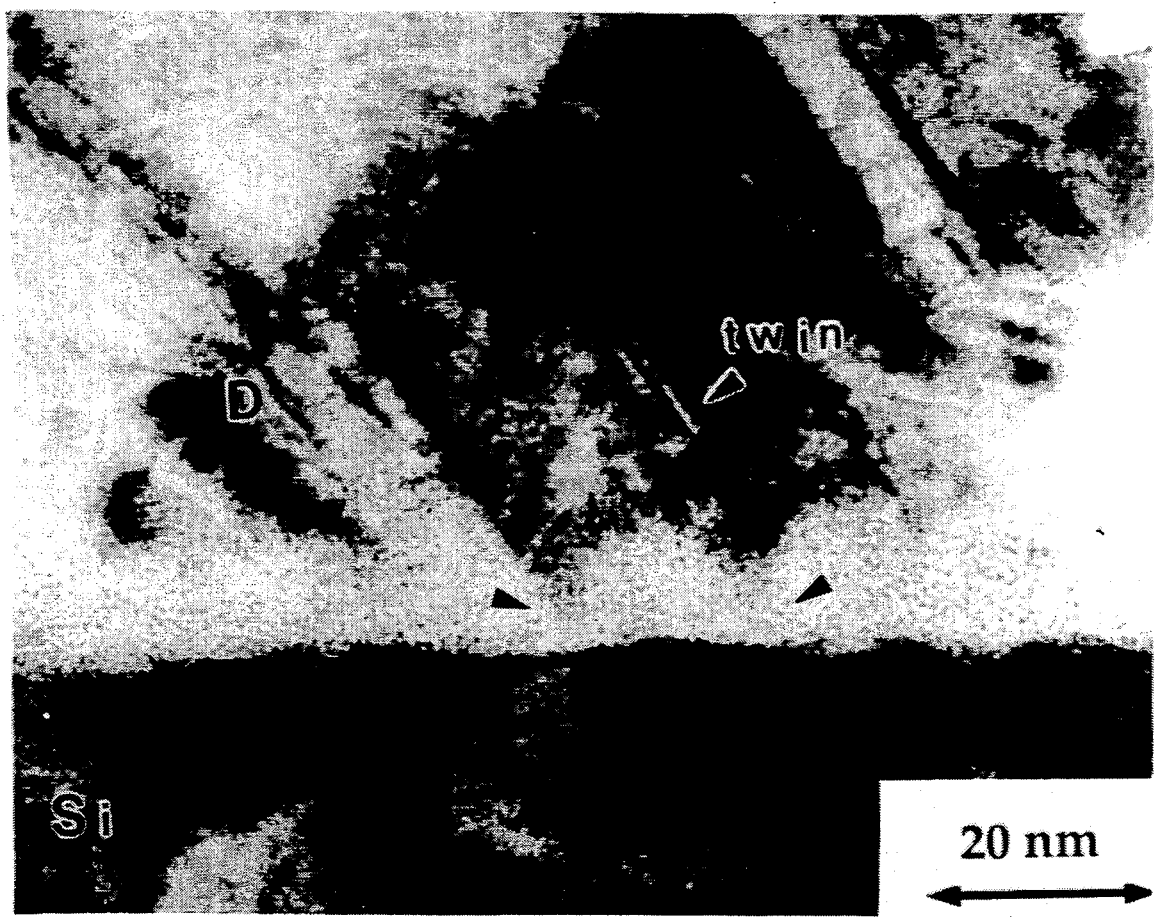
FIG. 15 is a low magnification high resolution XTEM of an interfacial film between silicon and diamond corresponding to Example 5.

FIG. 15 shows a low magnification high resolution XTEM micrograph from a sample that had been biased for 1 hour, and then grown on for 5 hours using an apparatus similar to that shown in FIGS. 1A and 1B. The electron beam direction was parallel to the Si<110>, such that the sample was viewed in an exact edge-on condition. An interfacial film is readily observed between the silicon substrate and the diamond film. Several diamond nuclei are seen to be emerging from this interfacial film, and none were observed to be in direct contact with the Si substrate. This divergence of the initial nuclei reconfirms that CVD diamond undergoes three-dimensional growth once the stable nuclei have formed. Twin lamellae, prominent defects in diamond, were also observed just above where the nuclei begin to coalesce as shown by the arrows in FIG. 15.

Figure 16:
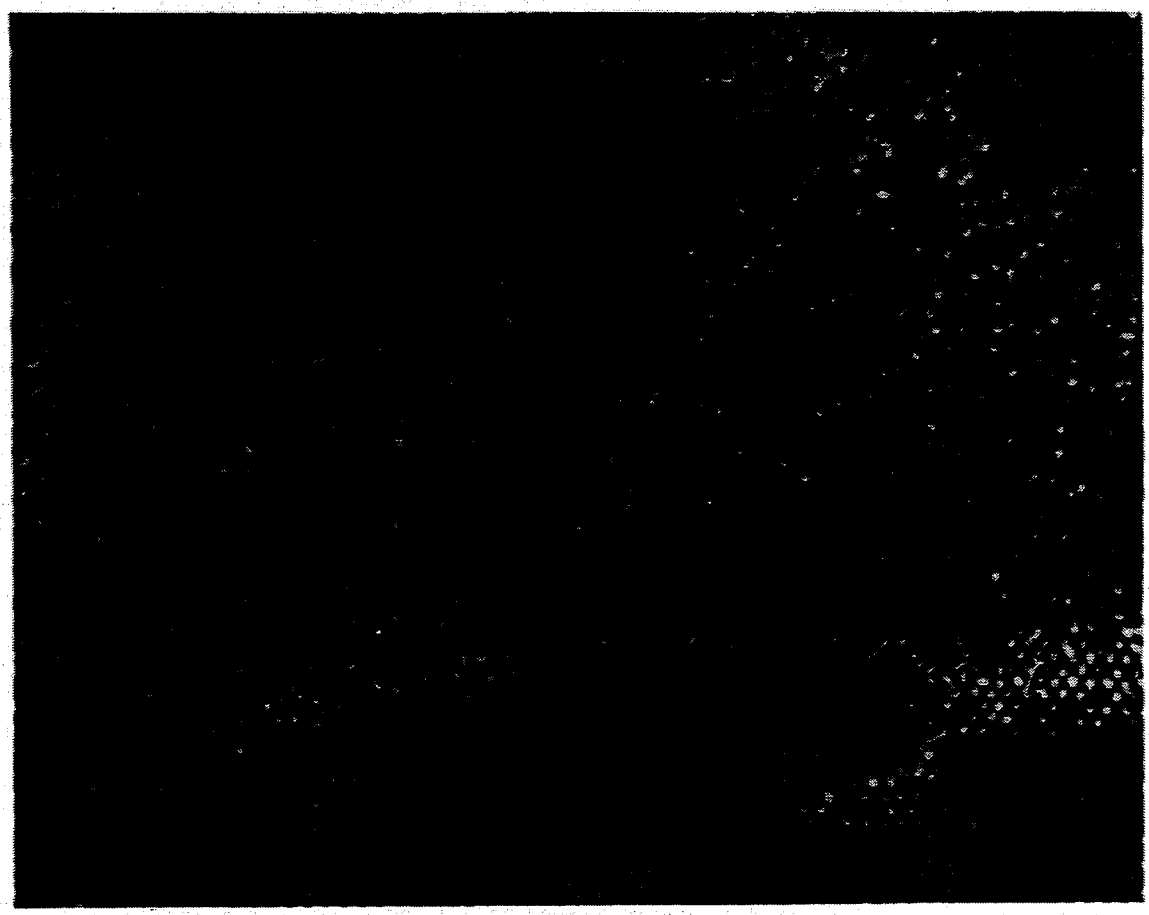
FIG. 16 is an high magnification high resolution XTEM of an amorphous interfacial film between silicon and diamond corresponding to Example 5.

High resolution TEM images were also obtained in the same region, as shown in FIG. 16. The grainy appearance of this interfacial film under optimum focusing conditions revealed its non-crystalline, or amorphous character. This was then confirmed by electron microdiffraction and optical diffractogramography. EELS was not performed in this region since its thickness was below the spatial resolution limit required for microanalysis in TEM. However, transmission EELS was performed on a separate sample that had a much thicker interfacial film, and the spectra obtained were identical to a spectrum collected from single crystal $\beta$-SiC under similar operating conditions. No other elements were found in these EELS spectra. Combined with the in-vacuo surface analysis presented above, applicants theorize without wishing to be bound thereto, that this interfacial film is predominantly amorphous SiC. The interfacial film for the 1 hour bias sample appears to have an average thickness of approximately 60 Å, with some areas as thick as 100 Å.

Figure 17:
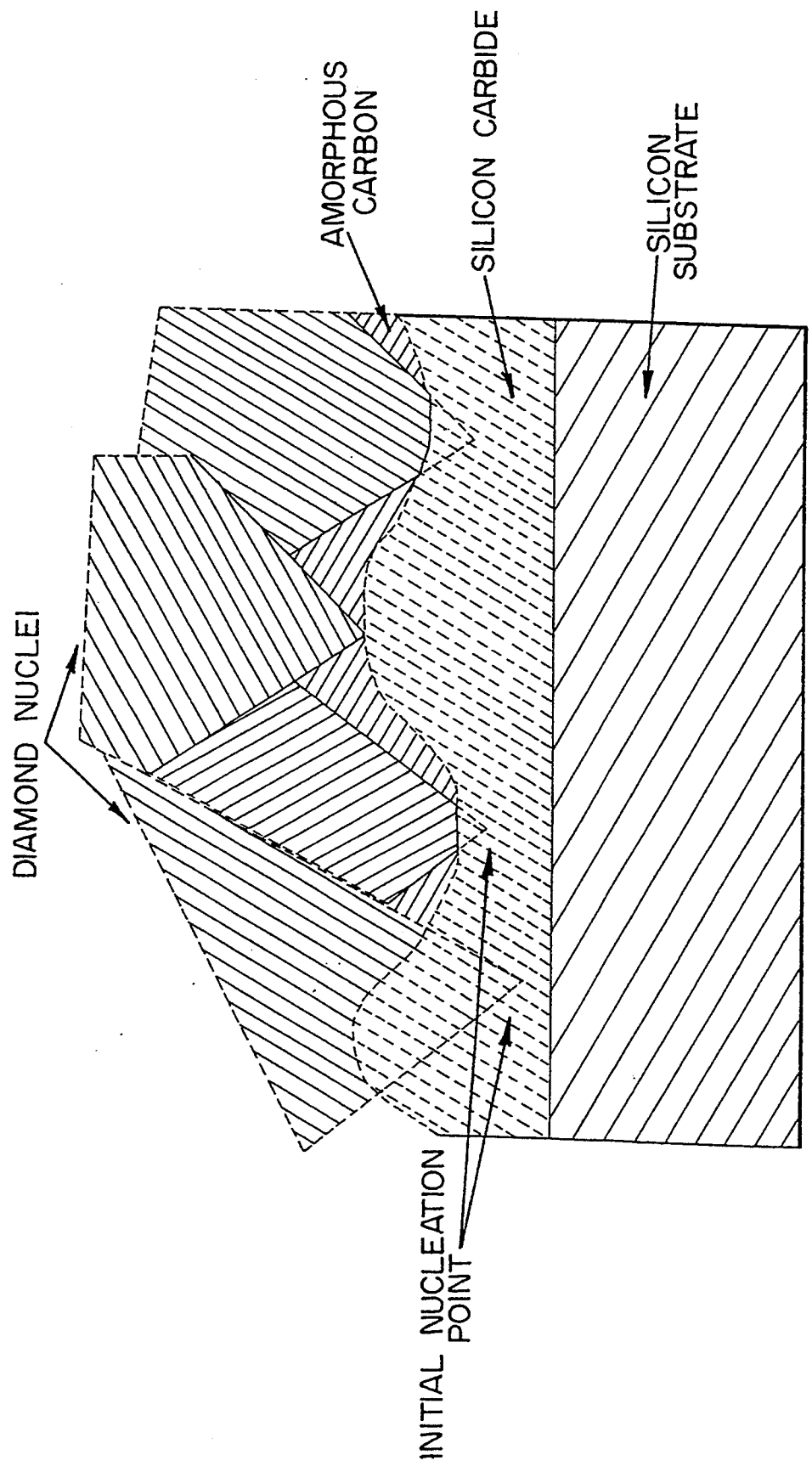
FIG. 17 is a schematic diagram of a model of diamond nuclei corresponding to Example 5.

From a nucleation standpoint, it is important to determine whether the nuclei actually formed on top of this amorphous film, or on the surface of the silicon. Because the sample is being viewed in cross-section, and due to the limited depth of field, the nuclei may only appear to have formed on top of the interfacial film. If one models the nuclei as an inverted pyramid, it is easy to envision how a cross-sectional slice not made in the exact center of the nuclei can make it appear to have originated further from the substrate. However, by tracing the boundaries of the nuclei to a converging point within the apparent interfacial film, it still appears that the nuclei originate above the silicon substrate. This is shown schematically in FIG. 17 and may also be seen in FIG. 16. Furthermore, in all of the samples examined, none of the diamond crystals were observed to be in direct contact with the Si substrate. Therefore, applicants theorize that nucleation did not occur on the silicon substrate directly, but rather on top of the interfacial film.

Along these lines, a schematic summary of a nucleation model, which applicants propose without wishing to be bound thereto, is shown in FIGS. 18A-18F. Before biasing begins, there is both adsorbed oxygen 90 and amorphous carbon 91 present on the silicon substrate 60 surface (FIG. 18A). The adsorbed carbon is then either etched away or converted to Si-C 92 and the physisorbed oxygen is converted into Si-O 93 (FIG. 18B). As biasing continues, the oxide is etched as the Si-C islands 92 continue to grow. Preferential etching of the silicon from the Si-C, and/or continued high flux of carbon to the surface creates an excess concentration of carbon 94 on the surface (FIG. 18C). As the local carbide islands reach a critical thickness, such that the continued carbide growth is unlikely, the excess carbon on the surface becomes free to form small clusters. Surface mobility of the carbon may be enhanced by the bombardment during the biasing. Some of the clusters become favorable for diamond 95 nucleation (FIG. 18D). As most of the carbide reaches a critical thickness, about 90 Å, more free carbon becomes available to form other diamond nucleation sites, and thus a greater number of diamond nuclei are shown in FIG. 18E. As biasing continues, there is ongoing etching of the surface, but not the more stable diamond nuclei, and adsorption of carbon. This local etching creates a rougher SiC surface. If silicon is preferentially etched from the carbide, increasing the carbon concentration in that region, then nucleation clusters may actually form on thinner areas of the carbide. The etching, cluster formation, and diamond nucleation continue until the surface is eventually covered with diamond nuclei as shown in FIG. 18F.

EXAMPLE 6

In this example, textured diamond growth was achieved on (001) $\beta$-SiC substrates using an apparatus similar to that shown in FIGS. 1A and 1B. Prior attempts to grow diamond on on-axis and off-axis $\beta$-SiC have been unsuccessful and typical scratching with diamond powder was required in order to obtain significant nucleation. The present results were obtained by pretreating the substrate as described above followed by standard microwave plasma CVD. Using the bias-enhanced nucleation pretreatment according to the present invention, (001) textured diamond particles were grown that were also azimuthally aligned relative to the substrate.

Diamond was deposited on 1 inch (001) $\beta$-SiC films that were grown epitaxially in a separate reactor on (001) Si substrates using conventional CVD techniques. The $\beta$-SiC films (4–5 $\mu$m thick) were prepared by polishing down the surface roughness with 0.1 $\mu$m diamond paste and then oxidizing in $O_2$ at 1200° C. to remove the polishing damage. Just prior to insertion into the CVD growth chamber, the oxide was stripped using a 10:1 mixture of HF:DI-$H_2O$ followed by a DI water rinse and drying with nitrogen.

The pretreatment and growth parameters are outlined in Table 7 below.

TABLE 7

| PARAMETER | PRETREATMENT | GROWTH |
|---|---|---|
| $CH_4/H_2$ (%) | 2% | 0.5% |
| Flow Rate (sccm) | 1000 | 1000 |
| Power (watts) | 550 | 600 |
| Pressure (torr) | 15 | 25 |
| Distance from Plasma (cm) | immersed | 1 cm |
| Substrate Temperature (°C.) | 650 | 650–700 |
| Bias, Voltage, Current (V, mA) | −250,100–150 | floating |
| Time (hrs) | 0.5 | 10,35,50 |

The pretreatment consisted of electrically biasing the substrate holder for 30 minutes at −250 volts while it was immersed in a 2% methane-in-hydrogen plasma. The pressure was 15 torr, the microwave power was 600 watts, and total flow rate was 1000 sccm. The substrate temperature was approximately 650° C. and the resulting current was 100–150 mA, collected through the substrate holder with a top surface diameter of 1.5 inches.

After the 30 minute pretreatment, the voltage was turned off, and the substrate was moved to a position approximately 1 cm from the edge of the plasma. The methane concentration was reduced to 0.5%, the pressure increased to 25 torr, and the temperature was maintained at 650°–700° C. These growth conditions resulted in high quality diamond films with little secondary nucleation and modest growth rates of approximately 0.05 $\mu$m/hour.

A $\beta$-SiC sample was grown on under the above condition for 10, 35, and 50 hours and then subsequently analyzed following each growth period. Scanning electron microscopy (SEM), and Raman spectroscopy were used to characterize the diamond on SiC. After the analysis, the sample was rinsed with DI water, blown dry with nitrogen and then reinserted into the chamber for continued growth. In this manner, changes in the morphology and texture of the diamond could be observed with increased deposition time.

Figure 19A:
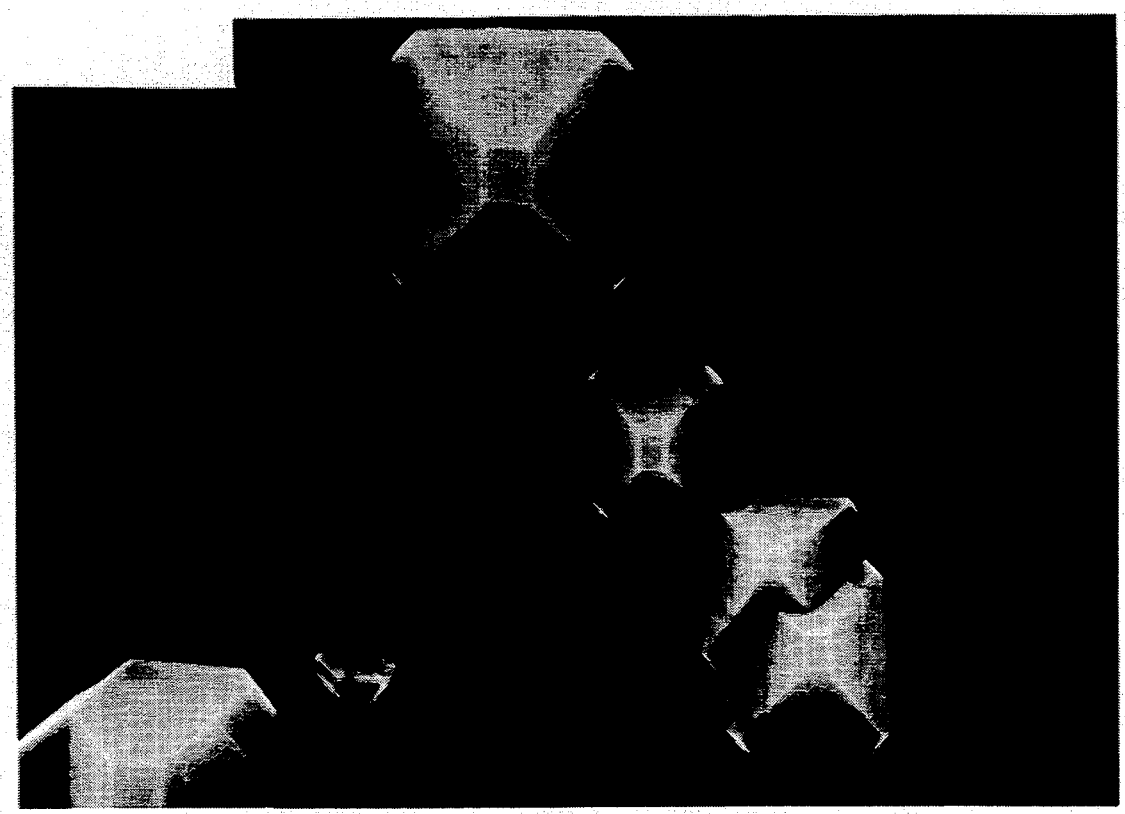
FIGS. 19A-19C are SEM photographs of the textured diamond film at the center, region between the center and the edge, and edge region, respectively, corresponding to Example 6.
Figure 19B:
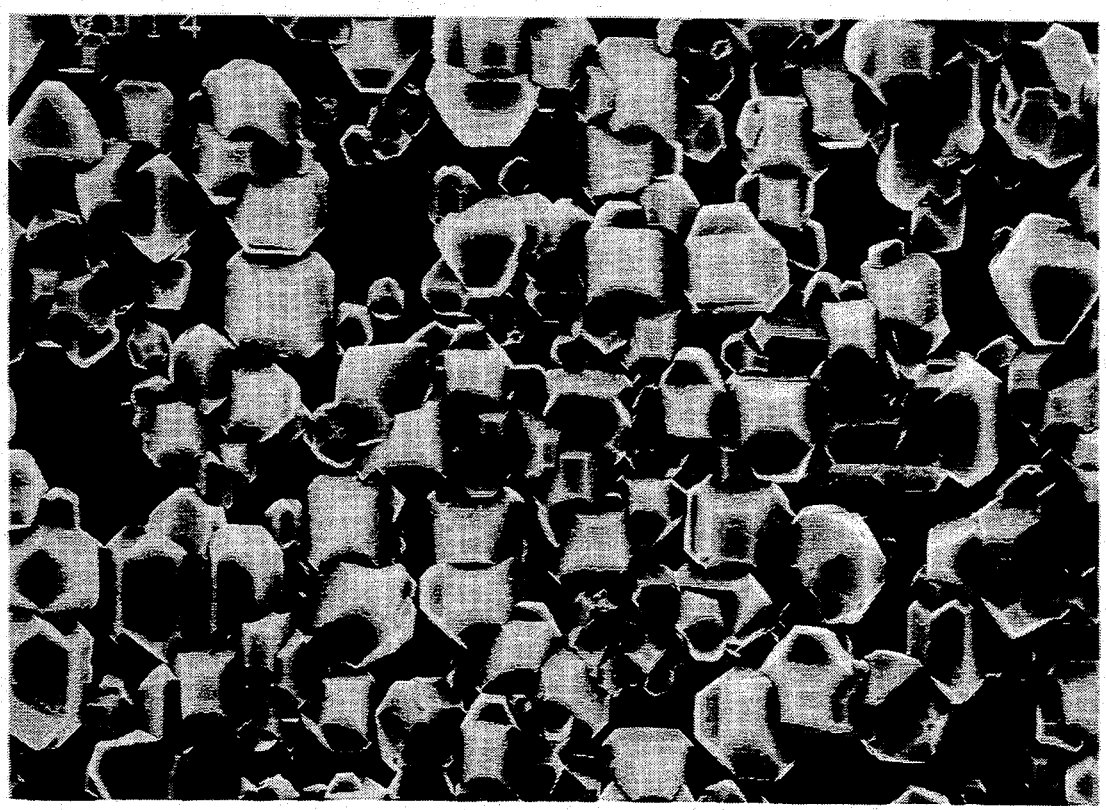
Figure 19C:
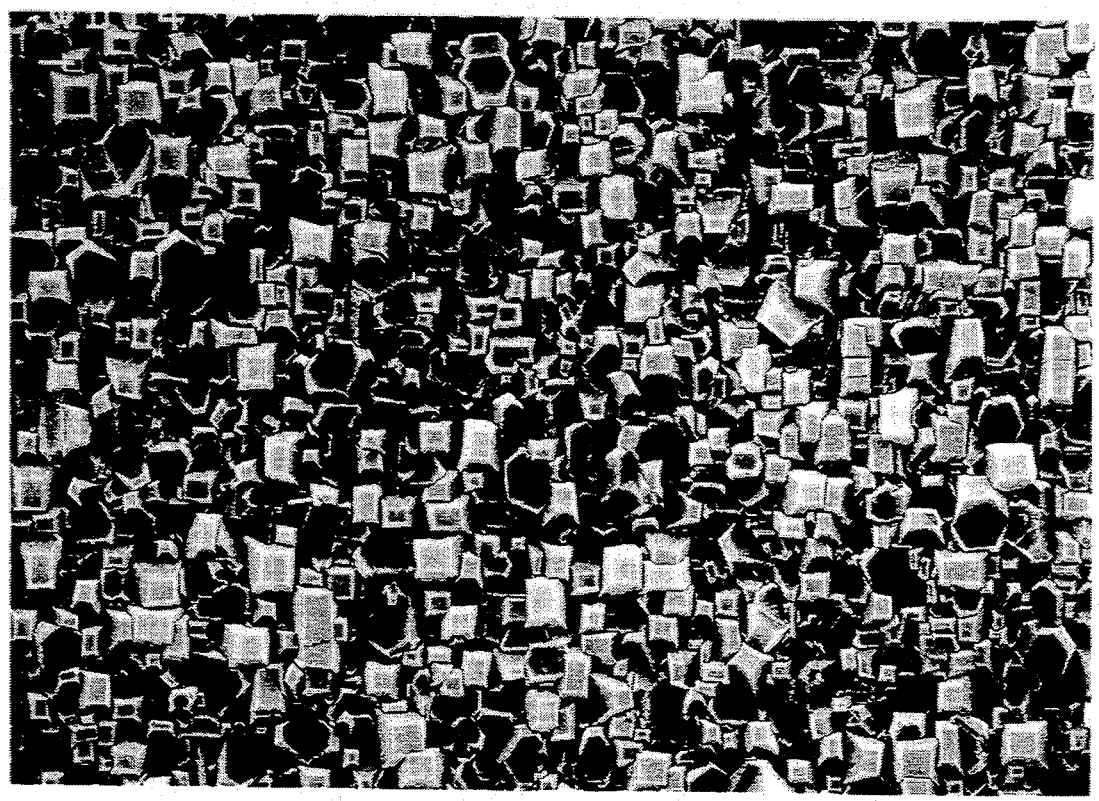

FIGS. 19A–19C show SEM micrographs taken at the center, between the center and the edge, and at the edge, respectively. The arrows, pointing in the SiC <110> direction show that over 50% of the diamond particles on the surface are both textured with (001) faces parallel to the SiC (001) and azimuthally aligned to within 3°, with the diamond <110> parallel to the <110> of SiC. The micrographs also depict the nonuniformity of the diamond deposition. This was most likely due to the relatively short length of the pretreatment which was only 0.5 hours. In other examples, a pretreatment of at least 1 hour was required to achieve uniform nucleation on a silicon substrate.

Figure 20:
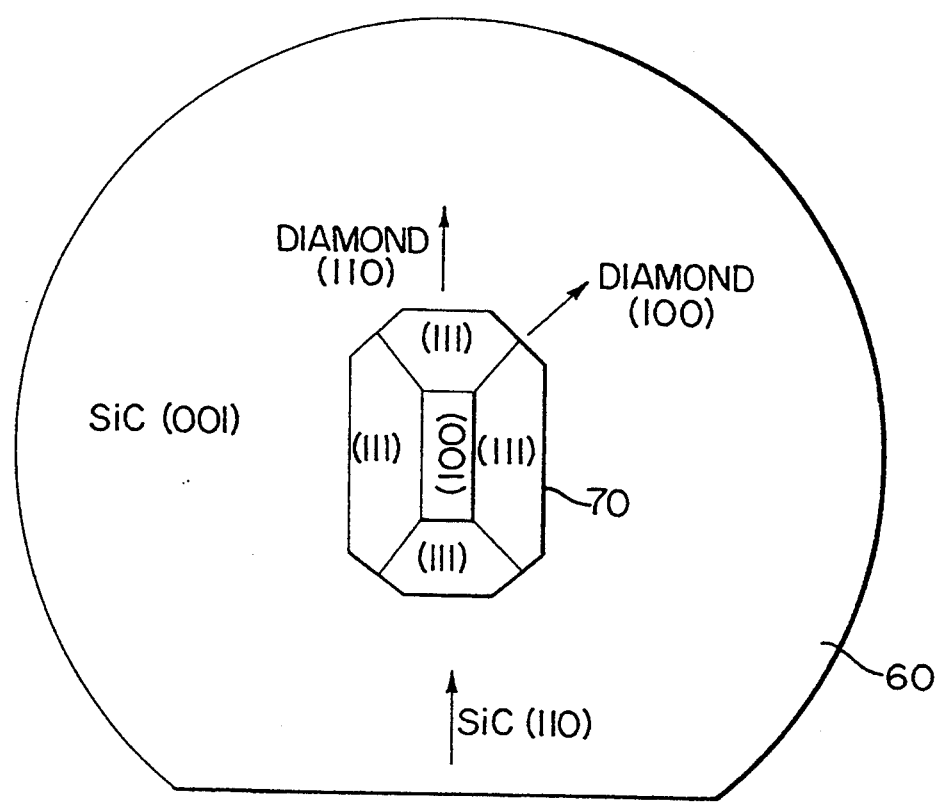
FIG. 20 is a schematic representation of the diamond particle orientation relative to the SiC substrate corresponding to Example 6.
Figure 21:
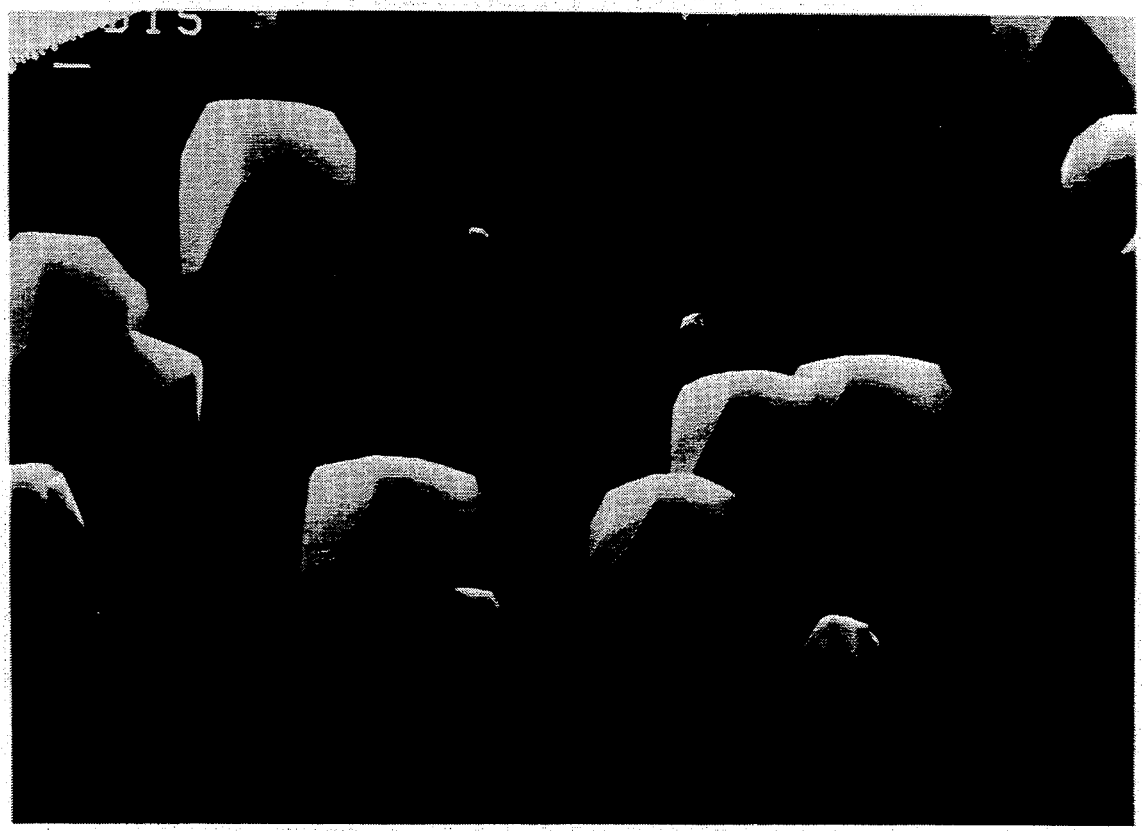
FIGS. 21 is an SEM photograph of the center region taken at a 45° tilt to show (111) faceting corresponding to Example 6.

FIG. 20 shows a schematic representation of an oriented diamond particle 70 on the SiC substrate 60. Higher growth in the <110> than in the <110> has made the top (001) face rectangular rather than square. FIG. 21 shows an SEM taken at 45°, indicating that the (111) are the most stable, slowest growing planes and are, therefore, the largest.

Figure 22:
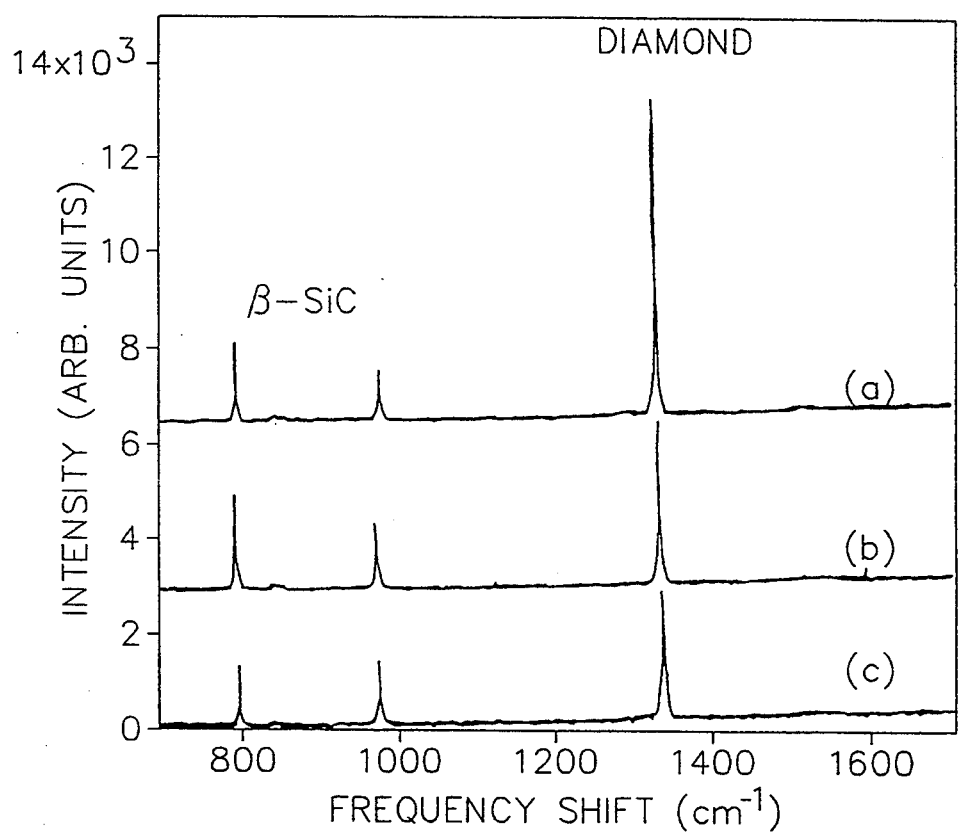
FIG. 22 is a Micro-Raman spectra taken from a SiC sample corresponding to Example 6.

Micro-Raman spectroscopy was performed on the sample after 50 hours of growth in the center region (a), the region between the center and the edge (b), and the edge region (c) as illustrated in the graph of FIG. 22. The spectra show that the diamond is of high quality with an undetectable graphitic component. Also observable are the SiC peaks at 796 and 973 cm−1.

Applicants theorize without wishing to be bound thereto that the biasing pretreatment according to the invention has played an important role in enhancing the nucleation on the β-SiC substrate without significantly damaging the surface so as to destroy its crystallinity. As described above, bias enhanced nucleation process via in vacuo surface analysis and TEM indicated that diamond nucleation on silicon was preceded by the formation of an interfacial carbide film covered with a very thin (5–10 Å) non-diamond carbon film. It was also found that the biasing process removed oxide and suppressed oxide formation on the surface. Since an amorphous oxide will have deleterious effects on heteroepitaxial nucleation, this oxide removal is believed to be an important factor in the promotion of the present heteroepitaxial nucleation and growth. Attempts to fully remove the oxide from both SiC and Si wafers without biasing proved unsuccessful, thus suggesting that original failures to achieve the heteroepitaxial nucleation of diamond on SiC may have been in part due to the inability to remove the surface oxide.

In the present study, the reduction in pretreatment time (from 1.5 hours in the previous study to 0.5 hours here) was believed to have minimized the surface damage while still creating sufficient nucleation via the impingement of carbon ions from the plasma. Applicants theorize that in conjunction with the oxide suppression, this has allowed the heteroepitaxial nucleation and growth of diamond on SiC in the present study.

This example illustrates that textured and locally heteroepitaxial diamond can be grown on (100) β-SiC substrate. Based on SEM observations, approximately 50% of the diamond nuclei are textured with the (001) parallel to the SiC substrate and are aligned azimuthally within 3°. The biasing pretreatment is theorized by the applicants to enhance the nucleation without damaging the substrate, thus allowing areas of limited epitaxy to occur.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for pretreating a substrate for the growth of a diamond film thereon, the method comprising the steps of:
   providing a diamond film adjacent the substrate such that the diamond film and the substrate are relatively positioned to both be exposed to a carbon-containing plasma; and
   electrically biasing the diamond film while exposing both the substrate and the thus biased diamond film to the carbon-containing plasma to thereby produce a high diamond nucleation density of the substrate.

2. A method according to claim 1 further comprising the step of electrically biasing the substrate while exposing both the thus biased substrate and the thus biased diamond film to the carbon-containing plasma.

3. A method according to claim 1 wherein the substrate is positioned on a substrate holder, and wherein the step of providing the diamond film adjacent the substrate comprises the step of forming the diamond film on a portion of the substrate holder.

4. A method according to claim 3 wherein the step of electrically biasing the diamond film comprises electrically biasing the substrate holder.

5. A method according to claim 4 wherein the step of electrically biasing the substrate holder comprises biasing same at a peak absolute value of not less than about 250 volts negative with respect to ground.

6. A method according to claim 5 wherein the step of exposing both the substrate and the diamond film to the carbon-containing plasma gas comprises exposing both the substrate and the diamond film to the carbon-containing plasma gas for a period of time in the range of about 1 hour to 2 hours.

7. A method according to claim 1 wherein the step of exposing both the substrate and the diamond film to the carbon-containing plasma comprises exposing both the substrate and the diamond film to the carbon-containing plasma having an atomic percentage of carbon of not more than about 0.3 atomic percent.

8. A method according to claim 7 wherein the step of exposing both the substrate and the diamond film to the carbon-containing plasma gas comprises exposing both the substrate and the diamond film to a methane gas plasma mixture having a percentage of methane of not more than about 5 percent by weight.

9. A method according to claim 1 further comprising the steps of monitoring the reflectivity of the substrate, and discontinuing the electrical biasing responsive to a change in reflectivity of the substrate indicative of the start of growth of a diamond film on the substrate.

10. A method according to claim 1 further comprising the step of maintaining the pressure of the carbon-containing plasma in the range of about 1 torr to 100 torr.

11. A method according to claim 1 further comprising the step of maintaining the temperature of the substrate and the diamond film in the range of about 350° C to 1000° C.

12. A method for pretreating a substrate for the growth of a heteroepitaxial diamond film thereon, the method comprising the steps of:
 forming a surface film on a substrate of a non-diamond material having a relatively close lattice match to diamond;
 providing a diamond film adjacent the substrate surface film such that the diamond film and the substrate surface film are relatively positioned to both be exposed to a carbon-containing plasma; and
 pretreating the substrate surface film by electrically biasing the diamond film while exposing both the substrate surface film and the thus biased diamond film to the carbon-containing plasma.

13. A method according to claim 12 wherein the non-diamond material of the substrate is selected from the group consisting of refractory metals and their carbides, cubic-boron nitride, α-silicon carbide, β-silicon carbide, copper, and nickel.

14. A method according to claim 13 further comprising the step of electrically biasing the substrate surface film while exposing both the thus biased substrate surface film and the thus biased diamond film to the carbon-containing plasma.

15. A method according to claim 12 wherein the substrate is positioned on a substrate holder, and wherein the step of providing the diamond film adjacent the substrate surface film comprises the step of forming the diamond film on a portion of the substrate holder.

16. A method according to claim 15 wherein the step of electrically biasing the diamond film comprises electrically biasing the substrate holder.

17. A method according to claim 16 wherein the step of electrically biasing the substrate holder comprises biasing same at a peak absolute value of not less than about 250 volts negative with respect to ground.

18. A method according to claim 17 wherein the step of exposing the substrate surface film and the diamond film to the carbon-containing plasma comprises exposing the substrate surface film and the diamond film to the carbon-containing plasma for a period of time of not more than about 0.5 hours.

19. A method according to claim 12 wherein the step of pretreating the substrate surface film is performed in an evacuable chamber, and wherein the step of forming the substrate surface film comprises depositing the substrate surface film in situ in the evacuable chamber.

20. A method according to claim 12 wherein the step of exposing both the substrate surface film and the diamond film to the carbon-containing plasma comprises exposing both the substrate surface film and the diamond film to the carbon-containing plasma having an atomic percentage of carbon of not more than about 0.3 atomic percent.

21. A method according to claim 20 wherein the step of exposing both the substrate surface film and the diamond film to the carbon-containing plasma gas comprises exposing both the substrate surface film and the diamond film to a methane gas plasma mixture having a percentage of methane of not more than about 5 percent by weight.

22. A method according to claim 12 further comprising the steps of monitoring the reflectivity of the substrate surface film, and discontinuing the electrical biasing responsive to a change in reflectivity of the substrate surface film indicative of the start of growth of a diamond film on the substrate surface film.

23. A method according to claim 12 further comprising the step of maintaining the pressure of the carbon-containing plasma in the range of about 1 torr to 100 torr.

24. A method according to claim 12 further comprising the step of maintaining the temperature of the substrate surface film and the diamond film in the range of about 350° C. to 1000° C.

25. A method according to claim 12 further comprising the steps of polishing the substrate surface film, oxidizing the thus polished film to remove polishing damage, and stripping the oxide from the film to prepare same for the pretreating step.

26. A method for forming a diamond film on a mirror finish substrate, said method comprising the steps of:
 providing a first diamond film adjacent the mirror finish substrate such that the first diamond film and the mirror finish substrate are relatively positioned to both be exposed to a carbon-containing plasma;
 pretreating the mirror finish substrate by electrically biasing the first diamond film while exposing both the mirror finish substrate and the thus biased first diamond film to the carbon-containing plasma; and
 growing a second diamond film on the thus pretreated mirror finish substrate while monitoring a relatively smooth growth surface of the second diamond film by laser reflection interferometry.

27. A method according to claim 26 further comprising the step of electrically biasing the mirror finish substrate while exposing both the thus biased mirror finish substrate and the thus biased first diamond film to the carbon-containing plasma.

28. A method according to claim 26 wherein the mirror finish substrate is positioned on a substrate holder, and wherein the step of providing the first diamond film adjacent the mirror finish substrate comprises the step of forming the first diamond film on a portion of the substrate holder.

29. A method according to claim 28 wherein the step of electrically biasing the first diamond film comprises electrically biasing the substrate holder.

30. A method according to claim 29 wherein the step of electrically biasing the substrate holder comprises biasing same at a peak absolute value of not less than about 250 volts negative with respect to ground.

31. A method according to claim 26 wherein the step of exposing both the mirror finish substrate and the first diamond film to the carbon-containing plasma comprises exposing both the mirror finish substrate and the first diamond film to a carbon-containing plasma having an atomic percentage of carbon of not more than about 0.3 atomic percent.

32. A method according to claim 31 wherein the step of exposing both the mirror finish substrate and the first diamond film to the carbon-containing plasma comprises exposing both the mirror finish substrate and the first diamond film to a methane gas plasma mixture having a percentage of methane of not more than about 5 percent by weight.

33. A method according to claim 26 wherein the step of growing the second diamond film on the pretreated mirror finish substrate comprises growing the second diamond film by chemical vapor deposition, and further comprising the step of controlling the chemical vapor deposition responsive to monitoring the relatively smooth growth surface of the second diamond film by laster reflection interferometry to achieve at least one of a desired growth rate and a desired quality of the second diamond film.

34. A method according to claim 26 further comprising the steps of monitoring the surface of the substrate by laser reflection interferometry during the pretreating step, and discontinuing the electrical biasing responsive to a change in the reflectivity of the substrate indicative of the start of growth of the second diamond film.

35. A method according to claim 26 further comprising the step of maintaining the pressure of the carbon-containing plasma in the range of about 1 torr to 100 torr.

36. A method according to claim 26 further comprising the step of maintaining the temperature of the mirror finish substrate and the first diamond film in the range of about 350° C. to 1000° C.

* * * * *